(12) United States Patent
Miyoshi

(10) Patent No.: US 11,910,159 B2
(45) Date of Patent: Feb. 20, 2024

(54) LAMINATED PIEZOELECTRIC ELEMENT AND ELECTROACOUSTIC TRANSDUCER

(71) Applicant: FUJIFILM Corporation, Tokyo (JP)

(72) Inventor: Tetsu Miyoshi, Minami-ashigara (JP)

(73) Assignee: FUJIFILM Corporation, Tokyo (JP)

( * ) Notice: Subject to any disclaimer, the term of this patent is extended or adjusted under 35 U.S.C. 154(b) by 321 days.

(21) Appl. No.: 17/314,171

(22) Filed: May 7, 2021

(65) Prior Publication Data

US 2021/0266678 A1 Aug. 26, 2021

Related U.S. Application Data

(63) Continuation of application No. PCT/JP2019/042768, filed on Oct. 31, 2019.

(30) Foreign Application Priority Data

| Nov. 8, 2018 | (JP) | 2018-210946 |
| Jan. 30, 2019 | (JP) | 2019-014089 |
| Oct. 15, 2019 | (JP) | 2019-188909 |

(51) Int. Cl.
*H04R 17/00* (2006.01)
*H04R 7/06* (2006.01)
(Continued)

(52) U.S. Cl.
CPC ............ *H04R 17/005* (2013.01); *B32B 3/04* (2013.01); *B32B 7/12* (2013.01); *B32B 27/20* (2013.01);
(Continued)

(58) Field of Classification Search
CPC .... H10N 30/50; H10N 30/857; H10N 30/875; H10N 30/05; H10N 30/852; H10N 30/01;
(Continued)

(56) References Cited

U.S. PATENT DOCUMENTS 5,153,859 A * 10/1992 Chatigny ............. H10N 30/857
29/25.35
10,147,868 B2 * 12/2018 Ozawa ................. H04R 17/005
(Continued)

FOREIGN PATENT DOCUMENTS

| CN | 101964392 A | 2/2011 |
| EP | 0 528 279 A1 | 2/1993 |

(Continued)

OTHER PUBLICATIONS

Translation of Japanese Patent Document JP2015070110 (Year: 2015).*

(Continued)

*Primary Examiner* — Brian Ensey
(74) *Attorney, Agent, or Firm* — Birch, Stewart, Kolasch & Birch, LLP

(57) ABSTRACT

An object is to provide a laminated piezoelectric element capable of preventing a short circuit between adjacent piezoelectric films and an electroacoustic transducer using the laminated piezoelectric element. The object is solved by laminating a plurality of layers of piezoelectric films polarized in a thickness direction, in which a piezoelectric layer is interposed between two thin film electrodes, and causing polarization directions of the adjacent piezoelectric films to be opposite to each other.

17 Claims, 10 Drawing Sheets

(51) Int. Cl.

| | | |
|---|---|---|
| *B32B 3/04* | (2006.01) | |
| *B32B 7/12* | (2006.01) | |
| *B32B 27/20* | (2006.01) | |
| *B32B 27/30* | (2006.01) | |
| *H04R 1/06* | (2006.01) | |
| *H10N 30/50* | (2023.01) | |
| *H10N 30/857* | (2023.01) | |
| *H10N 30/87* | (2023.01) | |

(52) U.S. Cl.
CPC .............. *B32B 27/306* (2013.01); *H04R 1/06* (2013.01); *H04R 7/06* (2013.01); *H10N 30/50* (2023.02); *H10N 30/857* (2023.02); *H10N 30/875* (2023.02); *B32B 2307/20* (2013.01); *B32B 2307/42* (2013.01); *B32B 2457/00* (2013.01)

(58) Field of Classification Search
CPC ...... H10N 30/20; H10N 30/85; H04R 17/005; H04R 1/06; H04R 7/06; H04R 17/00; B32B 3/04; B32B 7/12; B32B 2307/20; B32B 2307/42; B32B 2457/00; B32B 2264/107; B32B 3/266; B32B 307/51
See application file for complete search history.

(56) References Cited

U.S. PATENT DOCUMENTS

| | | |
|---|---|---|
| 2014/0210309 A1 | 7/2014 | Miyoshi |
| 2018/0160248 A1 | 6/2018 | Murakami et al. |
| 2019/0141433 A1 | 5/2019 | Miyoshi et al. |
| 2021/0400395 A1 | 12/2021 | Miyoshi |
| 2022/0013710 A1 | 1/2022 | Miyoshi |

FOREIGN PATENT DOCUMENTS

| | | |
|---|---|---|
| JP | 59-178782 A | 10/1984 |
| JP | 61-81000 A | 4/1986 |
| JP | 61-26206 A | 2/1988 |
| JP | 2014-14063 A | 1/2014 |
| JP | 2016-70110 A | 4/2015 |
| TW | 201401590 A | 1/2014 |
| WO | WO 2017/018313 A1 | 2/2017 |
| WO | WO 2018/020887 A1 | 2/2018 |
| WO | WO 2018/078053 A1 | 4/2019 |
| WO | WO 2020/179353 A1 | 9/2020 |
| WO | WO 2020/196850 A1 | 10/2020 |
| WO | WO 2020/261954 A1 | 12/2020 |

OTHER PUBLICATIONS

International Preliminary Report on Patentability and Written Opinion of the International Searching Authority, with an English translation, dated May 20, 2021, for International Application No. PCT/JP2019/042766.
European Communication pursuant to Article 94(3) EPC for European Application No. 19882164.7, dated Nov. 17, 2022.
Japanese Notice of Reasons for Refusal for Japanese Application No. 2020-556020, dated Jun. 28, 2022, with an English translation.
Extended European Search Report for European Application No. 19882164.7, dated Nov. 29, 2021.
Korean Office Action dated Aug. 16, 2023 for Application No. 10-2021-7012937 with an English translation.
European Office Action dated Jul. 20, 2023 for Application No. 19 882 164.7.
Taiwanese Office Action and Search Report dated Aug. 22, 2023 for Application No. 108140309 with an English translation.
Japanese Office Action dated Dec. 12, 2023 for Application No. 2023-000124 with an English translation.

* cited by examiner

LAMINATED PIEZOELECTRIC ELEMENT AND ELECTROACOUSTIC TRANSDUCER

CROSS-REFERENCE TO RELATED APPLICATIONS

This application is a Continuation of PCT International Application No. PCT/JP2019/042768 filed on Oct. 31, 2019, which claims priority under 35 U.S.C. § 119(a) to Japanese Patent Application No. 2018-210946 filed on Nov. 8, 2018, Japanese Patent Application No. 2019-014089 filed on Jan. 30, 2019 and Japanese Patent Application No. 2019-188909 filed on Oct. 15, 2019. Each of the above applications is hereby expressly incorporated by reference, in its entirety, into the present application.

BACKGROUND OF THE INVENTION

1. Field of the Invention

The present invention relates to a laminated piezoelectric element used for an exciter or the like, and an electroacoustic transducer using the laminated piezoelectric element.

2. Description of the Related Art

So-called exciters, which are brought into contact and attached to various articles and vibrate the articles to make a sound, are used for various usages.

For example, in an office, by attaching an exciter to a conference table, a whiteboard, a screen, or the like during a presentation, a telephone conference, or the like, a sound can be produced instead of a speaker. In the case of a vehicle such as an automobile, by attaching an exciter to the console, the A pillar, the roof, or the like, a guide sound, a warning sound, music, or the like can be sounded. Furthermore, in the case of an automobile that does not produce an engine sound, such as a hybrid vehicle and an electric vehicle, by attaching an exciter to the bumper or the like, a vehicle approach warning sound can be produced from the bumper or the like.

As a variable element that generates vibration in such an exciter, a combination of a coil and a magnet, a vibration motor such as an eccentric motor and a linear resonance motor, and the like are known.

It is difficult to reduce the thickness of these variable elements. In particular, the vibration motor has disadvantages that a mass body needs to be increased in order to increase the vibration force, frequency modulation for controlling the degree of vibration is difficult, and a response speed is slow.

SUMMARY OF THE INVENTION

As a variable element capable of solving such a problem, a laminated piezoelectric element in which a piezoelectric film having a piezoelectric layer interposed between electrode layers is used and a plurality of layers of piezoelectric films are laminated can be considered.

Although the piezoelectric film itself has low rigidity, the rigidity of the entire element can be increased by laminating the piezoelectric films. Moreover, the laminate of the piezoelectric films is very suitable because a high electric field strength can be secured without increasing the driving voltage.

Here, in a laminated piezoelectric element in which piezoelectric films are laminated, it is conceivable to bond the piezoelectric films with an adhesive or the like. On the other hand, in a laminated piezoelectric element in which piezoelectric films are adhered, the thinner the adhesive layer, the higher the performance.

However, in the laminated piezoelectric element in which the piezoelectric films are adhered, in a case where the adhesive layer is made thin, there is a very high risk of a short circuit between adjacent piezoelectric films. Therefore, in order to obtain a laminated piezoelectric element with high performance, it is difficult to sufficiently thin the adhesive layer.

An object of the present invention is to solve such a problem in the related art, and is to provide a laminated piezoelectric element capable of preventing a short circuit between adjacent piezoelectric films in a laminated piezoelectric element formed by laminating a plurality of piezoelectric films, and sufficiently thinning an adhesive layer and achieving high performance, for example, even in a case where the adjacent piezoelectric films are adhered, and an electroacoustic transducer using the laminated piezoelectric element.

In order to achieve such an object, the present invention has the following configurations.

[1] A laminated piezoelectric element including: a plurality of layers of laminated piezoelectric films having a piezoelectric layer interposed between two thin film electrodes, in which the piezoelectric film is polarized in a thickness direction, and polarization directions of adjacent piezoelectric films are opposite to each other.

[2] The laminated piezoelectric element according to [1], in which the piezoelectric film is laminated in a plurality of layers by folding back the piezoelectric film a plurality of times.

[3] The laminated piezoelectric element according to [2], in which a folded-back portion of the piezoelectric film has a core rod.

[4] The laminated piezoelectric element according to [2] or [3], in which a bent portion of the piezoelectric film formed by the folding-back extends along a longitudinal direction.

[5] The laminated piezoelectric element according to [2] or [3], in which a bent portion of the piezoelectric film formed by the folding-back extends along a lateral direction.

[6] The laminated piezoelectric element according to any one of [1] to [5], in which at least one layer of the laminated piezoelectric film has a protective layer laminated on at least one of the thin film electrodes.

[7] The laminated piezoelectric element according to any one of [1] to [6], further including: a bonding layer which bonds the adjacent piezoelectric films to each other.

[8] The laminated piezoelectric element according to [7], in which a thickness of the bonding layer is smaller than a thickness of the piezoelectric layer.

[9] The laminated piezoelectric element according to [7] or [8], in which the thickness of the bonding layer is 0.1 to 50 μm.

[10] The laminated piezoelectric element according to any one of [7] to [9], in which the bonding layer is a layer consisting of an adhesive.

[11] The laminated piezoelectric element according to any one of [7] to [10], in which a spring constant of the bonding layer is equal to or less than a spring constant of the piezoelectric film.

[12] The laminated piezoelectric element according to any one of [7] to [11], in which the bonding layer has conductivity.

[13] The laminated piezoelectric element according to any one of [1] to [12], in which, in the piezoelectric film, a local maximum value of a loss tangent (Tan δ) at a frequency of 1 Hz according to dynamic viscoelasticity measurement exists at room temperature.

[14] The laminated piezoelectric element according to any one of [1] to [13], in which the piezoelectric film has no in-plane anisotropy in piezoelectric properties.

[15] The laminated piezoelectric element according to any one of [1] to [14], in which the piezoelectric layer is a polymer composite piezoelectric layer in which piezoelectric particles are dispersed in a polymer material having a cyanoethyl group.

[16] The laminated piezoelectric element according to [15], in which the polymer material is cyanoethylated polyvinyl alcohol.

[17] The laminated piezoelectric element according to any one of [1] to [16], further including: a lead-out wire which is connected to the thin film electrode for connection to an external device, in which a value obtained by dividing a current value flowing into the lead-out wire by a width of the lead-out wire is 1 A/cm or less.

[18] An electroacoustic transducer including: the laminated piezoelectric element according to any one of [1] to [17]; and a vibration plate in contact with the laminated piezoelectric element.

According to the present invention as described above, it is possible to provide a laminated piezoelectric element capable of preventing a short circuit between adjacent piezoelectric films in a laminated piezoelectric element formed by laminating a plurality of piezoelectric films, and sufficiently thinning an adhesive layer and achieving high performance, for example, even in a case where the adjacent piezoelectric films are adhered by the adhesive layer, and a high-performance electroacoustic transducer using the laminated piezoelectric element.

DESCRIPTION OF THE PREFERRED EMBODIMENTS

Hereinafter, a laminated piezoelectric element and an electroacoustic transducer of the embodiment of the present invention will be described in detail based on the suitable embodiments shown in the accompanying drawings.

Descriptions of the constituent requirements described below may be made based on representative embodiments of the present invention, but the present invention is not limited to such embodiments.

In the present specification, a numerical range expressed using "to" means a range including numerical values described before and after "to" as a lower limit and an upper limit.

Figure 1:
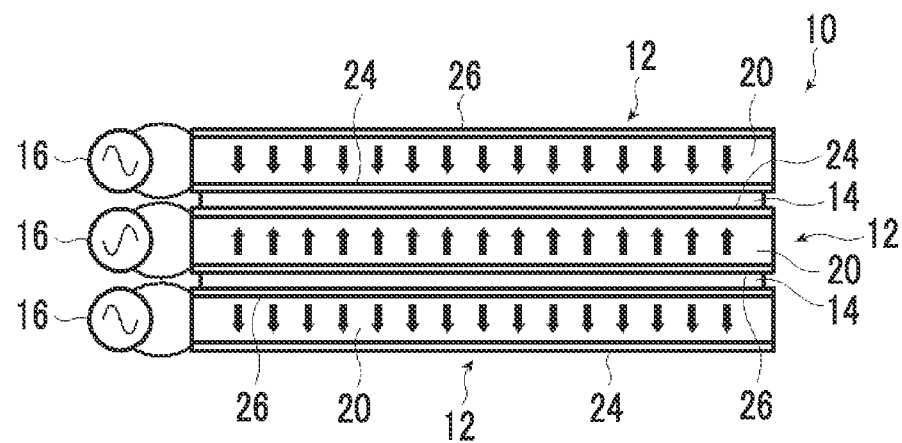
FIG. 1 is a diagram conceptually illustrating an example of a laminated piezoelectric element of the present invention.

FIG. 1 conceptually illustrates an example of the laminated piezoelectric element of the embodiment of the present invention.

A laminated piezoelectric element 10 illustrated in FIG. 1 has a configuration in which three piezoelectric films 12 are laminated and adjacent piezoelectric films 12 are bonded to each other by a bonding layer 14. A power source 16 for applying a driving voltage for stretching and contracting the piezoelectric film 12 is connected to each piezoelectric film 12.

The laminated piezoelectric element 10 illustrated in FIG. 1 is formed by laminating three piezoelectric films 12, but the present invention is not limited thereto. That is, the number of laminated piezoelectric films 12 may be two layers or four or more layers as long as the laminated piezoelectric element of the embodiment of the present invention is formed by laminating a plurality of layers of the piezoelectric films 12. In this regard, the same applies to a laminated piezoelectric element 56 illustrated in FIG. 9, which will be described later.

Figure 2:
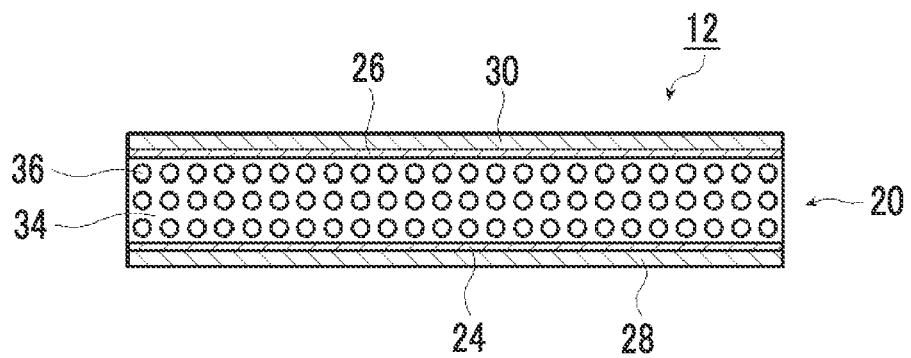
FIG. 2 is a diagram conceptually illustrating an example of a piezoelectric film included in the laminated piezoelectric element illustrated in FIG. 1.

FIG. 2 conceptually illustrates the piezoelectric film 12 in a cross-sectional view.

As illustrated in FIG. 2, the piezoelectric film 12 has a piezoelectric layer 20 which is a sheet-like material having piezoelectric properties, a lower thin film electrode 24 laminated on one surface of the piezoelectric layer 20, a lower protective layer 28 laminated on the lower thin film electrode 24, an upper thin film electrode 26 laminated on the other surface of the piezoelectric layer 20, and an upper protective layer 30 laminated on the upper thin film electrode 26. As will be described later, the piezoelectric film 12 is polarized in a thickness direction.

In addition, in order to simplify the drawing and clearly show the configuration of the laminated piezoelectric element 10, the lower protective layer 28 and the upper protective layer 30 are omitted in FIG. 1.

In the piezoelectric film 12, as a preferable aspect, as conceptually illustrated in FIG. 2, the piezoelectric layer 20 consists of a polymer composite piezoelectric body in which piezoelectric particles 36 are dispersed in a viscoelastic matrix 34 consisting of a polymer material having viscoelasticity at room temperature. Furthermore, in this specification, the "room temperature" indicates a temperature range of approximately 0° C. to 50° C.

Here, it is preferable that the polymer composite piezoelectric body (the piezoelectric layer 20) has the following requisites.

(i) Flexibility

For example, in a case of being gripped in a state of being loosely bent like a newspaper or a magazine as a portable device, the polymer composite piezoelectric body is continuously subjected to large bending deformation from the outside at a comparatively slow vibration of less than or equal to a few Hz. In this case, in a case where the polymer composite piezoelectric body is hard, large bending stress is generated to that extent, and a crack is generated at the interface between the polymer matrix and the piezoelectric particles, possibly leading to breakage. Accordingly, the polymer composite piezoelectric body is required to have suitable flexibility. In addition, in a case where strain energy is diffused into the outside as heat, the stress is able to be relieved. Accordingly, the loss tangent of the polymer composite piezoelectric body is required to be suitably large.

As described above, a flexible polymer composite piezoelectric body used as an exciter is required to be rigid with respect to a vibration of 20 Hz to 20 kHz, and be flexible with respect to a vibration of less than or equal to a few Hz. In addition, the loss tangent of the polymer composite piezoelectric body is required to be suitably large with respect to the vibration of all frequencies of less than or equal to 20 kHz.

Furthermore, it is preferable that the spring constant can be easily controlled by lamination according to the rigidity of a mating material to be attached. In this case, the thinner the bonding layer 18 is, the higher the energy efficiency can be. As the mating material to be attached, for example, a vibration plate is exemplified. The rigidity of the mating material to be attached is, for example, hardness, stiffness, or spring constant.

In general, a polymer solid has a viscoelasticity relieving mechanism, and a molecular movement having a large scale is observed as a decrease (relief) in a storage elastic modulus (Young's modulus) or the local maximum (absorption) in a loss elastic modulus along with an increase in a temperature or a decrease in a frequency. Among them, the relief due to a microbrown movement of a molecular chain in an amorphous region is referred to as main dispersion, and an extremely large relieving phenomenon is observed. A temperature at which this main dispersion occurs is a glass transition point (Tg), and the viscoelasticity relieving mechanism is most remarkably observed.

In the polymer composite piezoelectric body (the piezoelectric layer 20), the polymer material of which the glass transition point is room temperature, in other words, the polymer material having viscoelasticity at room temperature is used in the matrix, and thus the polymer composite piezoelectric body which is rigid with respect to a vibration of 20 Hz to 20 kHz and is flexible with respect to a vibration of less than or equal to a few Hz is realized. In particular, from a viewpoint of preferably exhibiting such behavior, it is preferable that a polymer material of which the glass transition point at a frequency of 1 Hz is room temperature, that is, 0° C. to 50° C. is used in the matrix of the polymer composite piezoelectric body.

As the polymer material having viscoelasticity at room temperature, various known materials are able to be used. Preferably, a polymer material of which the local maximum value of a loss tangent Tan δ at a frequency of 1 Hz at room temperature, that is, 0° C. to 50° C. in a dynamic viscoelasticity test is greater than or equal to 0.5 is used.

Accordingly, in a case where the polymer composite piezoelectric body is slowly bent due to an external force, stress concentration on the interface between the polymer matrix and the piezoelectric particles at the maximum bending moment portion is relieved, and thus high flexibility is able to be expected.

In addition, it is preferable that, in the polymer material having viscoelasticity at room temperature, a storage elastic modulus (E') at a frequency of 1 Hz according to dynamic viscoelasticity measurement is greater than or equal to 100 MPa at 0° C. and is less than or equal to 10 MPa at 50° C.

Accordingly, it is possible to reduce a bending moment which is generated in a case where the polymer composite piezoelectric body is slowly bent due to the external force, and it is possible to make the polymer composite piezoelectric body rigid with respect to an acoustic vibration of 20 Hz to 20 kHz.

In addition, it is more suitable that the relative permittivity of the polymer material having viscoelasticity at room temperature is greater than or equal to 10 at 25° C. Accordingly, in a case where a voltage is applied to the polymer composite piezoelectric body, a higher electric field is applied to the piezoelectric particles in the polymer matrix, and thus a large deformation amount is able to be expected.

However, in consideration of securing good moisture resistance or the like, it is suitable that the relative permittivity of the polymer material is less than or equal to 10 at 25° C.

As the polymer material having viscoelasticity at room temperature and satisfying such conditions, cyanoethylated polyvinyl alcohol (cyanoethylated PVA), polyvinyl acetate, polyvinylidene chloride-co-acrylonitrile, a polystyrene-vinyl polyisoprene block copolymer, polyvinyl methyl ketone, polybutyl methacrylate, and the like are exemplified. In addition, as these polymer materials, a commercially available product such as Hybrar 5127 (manufactured by Kuraray Co., Ltd.) is also able to be suitably used. Among them, as the polymer material, a material having a cyanoethyl group is preferably used, and cyanoethylated PVA is particularly preferably used.

Furthermore, only one of these polymer materials may be used, or a plurality of types thereof may be used in combination (mixture).

The viscoelastic matrix 34 using such a polymer material having viscoelasticity at room temperature, as necessary, may use a plurality of polymer materials in combination.

That is, in order to control dielectric properties or mechanical properties, other dielectric polymer materials may be added to the viscoelastic matrix 34 in addition to the viscoelastic material such as cyanoethylated PVA, as necessary.

As the dielectric polymer material which is able to be added to the viscoelastic matrix, for example, a fluorine-based polymer such as polyvinylidene fluoride, a vinylidene fluoride-tetrafluoroethylene copolymer, a vinylidene fluoride-trifluoroethylene copolymer, a polyvinylidene fluoride-trifluoroethylene copolymer, and a polyvinylidene fluoride-tetrafluoroethylene copolymer, a polymer having a cyano group or a cyanoethyl group such as a vinylidene cyanide-vinyl acetate copolymer, cyanoethyl cellulose, cyanoethyl hydroxy saccharose, cyanoethyl hydroxy cellulose, cyanoethyl hydroxy pullulan, cyanoethyl methacrylate, cyanoethyl acrylate, cyanoethyl hydroxy ethyl cellulose, cyanoethyl amylose, cyanoethyl hydroxy propyl cellulose, cyanoethyl dihydroxy propyl cellulose, cyanoethyl hydroxy propyl amylose, cyanoethyl polyacryl amide, cyanoethyl polyacrylate, cyanoethyl pullulan, cyanoethyl polyhydroxy methylene, cyanoethyl glycidol pullulan, cyanoethyl saccharose, and cyanoethyl sorbitol, and a synthetic rubber such as nitrile rubber or chloroprene rubber are exemplified.

Among them, a polymer material having a cyanoethyl group is suitably used.

Furthermore, the dielectric polymer added to the viscoelastic matrix 34 of the piezoelectric layer 20 in addition to the material having viscoelasticity at room temperature such as cyanoethylated PVA is not limited to one dielectric polymer, and a plurality of dielectric polymers may be added.

In addition, for the purpose of controlling the glass transition point Tg, a thermoplastic resin such as a vinyl chloride resin, polyethylene, polystyrene, a methacrylic resin, polybutene, and isobutylene, and a thermosetting resin such as a phenol resin, a urea resin, a melamine resin, an alkyd resin, or mica may be added to the viscoelastic matrix 34 in addition to the dielectric polymer.

Furthermore, for the purpose of improving pressure sensitive adhesiveness, a viscosity imparting agent such as rosin ester, rosin, terpene, terpene phenol, and a petroleum resin may be added.

The amount of materials added to the viscoelastic matrix 34 of the piezoelectric layer 20 in a case where materials other than the polymer material having viscoelasticity such as cyanoethylated PVA is not particularly limited, and it is preferable that a ratio of the added materials to the viscoelastic matrix 34 is less than or equal to 30 mass %.

Accordingly, it is possible to exhibit properties of the polymer material to be added without impairing the viscoelasticity relieving mechanism of the viscoelastic matrix 34, and thus a preferable result is able to be obtained from a viewpoint of increasing a dielectric constant, of improving heat resistance, and of improving adhesiveness between the piezoelectric particles 36 and the electrode layer.

The piezoelectric particles 36 consist of ceramics particles having a perovskite type or wurtzite type crystal structure.

As the ceramics particles forming the piezoelectric particles 36, for example, lead zirconate titanate (PZT), lead lanthanum zirconate titanate (PLZT), barium titanate (BaTiO$_3$), zinc oxide (ZnO), and a solid solution (BFBT) of barium titanate and bismuth ferrite (BiFe$_3$) are exemplified.

The particle diameter of the piezoelectric particles 36 is not limited, and may be appropriately selected depending on the size of the piezoelectric film 12 and the usage of the laminated piezoelectric element 10. The particle diameter of the piezoelectric particles 36 is preferably 1 to 10 μm.

By setting the particle diameter of the piezoelectric particles 36 to be in the range described above, a preferable result is able to be obtained from a viewpoint of allowing the piezoelectric film 12 to achieve both high piezoelectric properties and flexibility.

In addition, in FIG. 2, the piezoelectric particles 36 in the piezoelectric layer 20 are uniformly dispersed in the viscoelastic matrix 34 with regularity. However, the present invention is not limited thereto.

That is, in the viscoelastic matrix 34, the piezoelectric particles 36 in the piezoelectric layer 20 are preferably uniformly dispersed, and may also be irregularly dispersed.

In the piezoelectric film 12, a quantitative ratio of the viscoelastic matrix 34 and the piezoelectric particles 36 in the piezoelectric layer 20 is not limited, and may be appropriately set according to the size in the surface direction or the thickness of the piezoelectric film 12, the usage of the laminated piezoelectric element 10, properties required for the piezoelectric film 12, and the like.

The volume fraction of the piezoelectric particles 36 in the piezoelectric layer 20 is set to preferably 30% to 80%, more preferably more than or equal to 50%, and therefore even more preferably 50% to 80%.

By setting the quantitative ratio of the viscoelastic matrix 34 and the piezoelectric particles 36 to be in the range described above, it is possible to obtain a preferable result from a viewpoint of making high piezoelectric properties and flexibility compatible.

In the above-mentioned piezoelectric film 12, as a preferable aspect, the piezoelectric layer 20 is a polymer composite piezoelectric layer formed by dispersing piezoelectric particles in a viscoelastic matrix containing a polymer material having viscoelasticity at room temperature. However, the present invention is not limited thereto, and various known piezoelectric layers used in known piezoelectric elements are able to be used as the piezoelectric layer of the piezoelectric film.

As an example, a piezoelectric layer consisting of the above-mentioned dielectric polymer material such as polyvinylidene fluoride (PVDF) and a vinylidene fluoride-tetrafluoroethylene copolymer, and a piezoelectric layer consisting of the above-mentioned piezoelectric body such as PZT, PLZT, barium titanate, zinc oxide, or BFBT are exemplified.

In the piezoelectric film 12, the thickness of the piezoelectric layer 20 is not particularly limited, and may be appropriately set according to the usage of the laminated piezoelectric element 10, the number of laminated piezoelectric films in the laminated piezoelectric element 10, properties required for the piezoelectric film 12, and the like.

The thicker the piezoelectric layer 20, the more advantageous it is in terms of rigidity such as the stiffness of a so-called sheet-like material, but the voltage (potential difference) required to stretch and contract the piezoelectric film 12 by the same amount increases.

The thickness of the piezoelectric layer 20 is preferably 10 to 300 μm, more preferably 20 to 200 μm, and even more preferably 30 to 150 μm.

By setting the thickness of the piezoelectric layer 20 to be in the range described above, it is possible to obtain a preferable result from a viewpoint of compatibility between securing the rigidity and appropriate flexibility, or the like.

As illustrated in FIG. 2, the piezoelectric film 12 in the illustrated example has a configuration in which the lower thin film electrode 24 is provided on one surface of the piezoelectric layer 20, the lower protective layer 28 is provided thereon, the upper thin film electrode 26 is provided on the other surface of the piezoelectric layer 20, and the upper protective layer 30 is provided thereon. Here, the upper thin film electrode 26 and the lower thin film electrode 24 form an electrode pair.

In addition to these layers, the piezoelectric film 12 has, for example, an electrode lead-out portion that leads out the electrodes from the upper thin film electrode 26 and the lower thin film electrode 24, and the electrode lead-out portion is connected to the power source 16. Furthermore, the piezoelectric film 12 may have an insulating layer which covers a region where the piezoelectric layer 20 is exposed for preventing a short circuit or the like.

That is, the piezoelectric film 12 has a configuration in which both surfaces of the piezoelectric layer 20 are interposed between the electrode pair, that is, the upper thin film electrode 26 and the lower thin film electrode 24 and the laminate is further interposed between the lower protective layer 28 and the upper protective layer 30.

As described above, in the piezoelectric film 12, the region interposed between the upper thin film electrode 26 and the lower thin film electrode 24 is stretched and contracted according to an applied voltage.

In the present invention, "upper" and "lower" in the lower thin film electrode 24, the lower protective layer 28, the upper thin film electrode 26, and the upper protective layer 30 are named according to the drawings for convenience in order to describe the piezoelectric film 12. Therefore, "upper" and "lower" in the piezoelectric film 12 have no technical meaning and are irrelevant to the actual usage state.

In the laminated piezoelectric element 10 of the present invention, the lower protective layer 28 and the upper protective layer 30 of the piezoelectric film 12 are provided as a preferable embodiment rather than essential constituent requirements.

In the piezoelectric film 12, the lower protective layer 28 and the upper protective layer 30 have a function of covering the upper thin film electrode 26 and the lower thin film electrode 24 and applying appropriate rigidity and mechanical strength to the piezoelectric layer 20. That is, there may be a case where, in the piezoelectric film 12, the piezoelectric layer 20 consisting of the viscoelastic matrix 34 and the piezoelectric particles 36 exhibits extremely superior flexibility under bending deformation at a slow vibration but has insufficient rigidity or mechanical strength depending on the usage. As a compensation for this, the piezoelectric film 12 is provided with the lower protective layer 28 and the upper protective layer 30.

In the laminated piezoelectric element 10 illustrated in FIG. 1, as a preferable embodiment, all the piezoelectric films 12 have both the lower protective layer 28 and the upper protective layer 30. However, the present invention is not limited thereto, and a piezoelectric film having the protective layer and a piezoelectric film not having the protective layer may be mixed. Furthermore, in a case where the piezoelectric film has the protective layer, the piezoelectric film may have only the lower protective layer 28 or only the upper protective layer 30. As an example, the laminated piezoelectric element 10 having a three-layer configuration as illustrated in FIG. 1 may have a configuration in which the piezoelectric film in the uppermost layer in the figure has only the upper protective layer 30, and the piezoelectric film in the middle has no protective layer, and the piezoelectric film in the lowermost layer has only the lower protective layer 28.

The lower protective layer 28 and the upper protective layer 30 are not limited, and may use various sheet-like materials. As an example, various resin films are suitably exemplified.

Among them, by the reason of excellent mechanical properties and heat resistance, a resin film consisting of polyethylene terephthalate (PET), polypropylene (PP), polystyrene (PS), polycarbonate (PC), polyphenylene sulfite (PPS), polymethyl methacrylate (PMMA), polyetherimide (PEI), polyimide (PI), polyethylene naphthalate (PEN), triacetylcellulose (TAC), or a cyclic olefin-based resin is suitably used.

There is also no limitation on the thicknesses of the lower protective layer 28 and the upper protective layer 30. In addition, the thicknesses of the lower protective layer 28 and the upper protective layer 30 may basically be identical to each other or different from each other.

Here, in a case where the rigidity of the lower protective layer 28 and the upper protective layer 30 is too high, not only is the stretching and contracting of the piezoelectric layer 20 constrained, but also the flexibility is impaired. Therefore, it is advantageous in a case where the thicknesses of lower protective layer 28 and the upper protective layer 30 are smaller unless mechanical strength or good handleability as a sheet-like material is required.

In the piezoelectric film 12, in a case where the thickness of the lower protective layer 28 and the upper protective layer 30 is less than or equal to twice the thickness of the piezoelectric layer 20, it is possible to obtain a preferable result from a viewpoint of compatibility between securing the rigidity and appropriate flexibility, or the like.

For example, in a case where the thickness of the piezoelectric layer 20 is 50 µm and the lower protective layer 28 and the upper protective layer 30 consist of PET, the thickness of the upper protective layer 30 and the lower protective layer 28 is preferably less than or equal to 100 µm, more preferably less than or equal to 50 µm, and even more preferably less than or equal to 25 µm.

In the piezoelectric film 12, the lower thin film electrode 24 is formed between the piezoelectric layer 20 and the lower protective layer 28, and the upper thin film electrode 26 is formed between the piezoelectric layer 20 and the upper protective layer 30. In the following description, the lower thin film electrode 24 is also referred to as a lower electrode 24, and the upper thin film electrode 26 is also referred to as an upper electrode 26.

The lower electrode 24 and the upper electrode 26 are provided to apply a voltage to the piezoelectric layer 20 (the piezoelectric film 12).

In the present invention, a forming material of the lower electrode 24 and the upper electrode 26 is not limited, and as the forming material, various conductive bodies are able to be used. Specifically, metals such as carbon, palladium, iron, tin, aluminum, nickel, platinum, gold, silver, copper, titanium, chromium, and molybdenum, alloys thereof, laminates and composites of these metals and alloys, indium-tin oxide, and the like are exemplified. Among them, copper, aluminum, gold, silver, platinum, and indium-tin oxide are suitably exemplified as the lower electrode 24 and the upper electrode 26.

In addition, a forming method of the lower electrode 24 and the upper electrode 26 is not limited, and various known methods such as a vapor-phase deposition method (a vacuum film forming method) such as vacuum vapor deposition or sputtering, film formation using plating, and a method of bonding a foil formed of the materials described above are able to be used.

Among them, in particular, by the reason that the flexibility of the piezoelectric film 12 is able to be secured, a thin film made of copper, aluminum, or the like formed by using the vacuum vapor deposition is suitably used as the lower electrode 24 and the upper electrode 26. Among them, in particular, the copper thin film formed by using the vacuum vapor deposition is suitably used.

There is no limitation on the thickness of the lower electrode 24 and the upper electrode 26. In addition, the thicknesses of the lower electrode 24 and the upper electrode 26 may basically be identical to each other or different from each other.

Here, similarly to the lower protective layer 28 and upper protective layer 30 mentioned above, in a case where the rigidity of the lower electrode 24 and the upper electrode 26 is too high, not only is the stretching and contracting of the piezoelectric layer 20 constrained, but also the flexibility is impaired. Therefore, it is advantageous in a case where the thicknesses of lower electrode 24 and the upper electrode 26 are smaller as long as electrical resistance is not excessively high.

In the piezoelectric film 12, in a case where the product of the thicknesses of the lower electrode 24 and the upper electrode 26 and the Young's modulus is less than the product of the thicknesses of the lower protective layer 28 and the upper protective layer 30 and the Young's modulus, the flexibility is not considerably impaired, which is suitable.

For example, in a case of a combination consisting of the lower protective layer 28 and the upper protective layer 30 formed of PET (Young's modulus: approximately 6.2 GPa) and the lower electrode 24 and the upper electrode 26 formed of copper (Young's modulus: approximately 130 GPa), in a case where the thickness of the lower protective layer 28 and the upper protective layer 30 is 25 μm, the thickness of the upper electrode 26 and the lower electrode 24 is preferably less than or equal to 1.2 μm, more preferably less than or equal to 0.3 μm, and particularly preferably less than or equal to 0.1 μm.

As described above, the piezoelectric film 12 has a configuration in which the piezoelectric layer 20 in which the piezoelectric particles 36 are dispersed in the viscoelastic matrix 34 containing the polymer material having viscoelasticity at room temperature is interposed between the lower electrode 24 and the upper electrode 26 and the laminate is interposed between the lower protective layer 28 and the upper protective layer 30.

In the piezoelectric film 12, it is preferable that the local maximum value of the loss tangent (Tan δ) at a frequency of 1 Hz according to the dynamic viscoelasticity measurement exists at room temperature, and it is more preferable that a local maximum value of greater than or equal to 0.1 exists at room temperature.

Accordingly, even in a case where the piezoelectric film 12 is subjected to large bending deformation from the outside at a comparatively slow vibration of less than or equal to a few Hz, it is possible to effectively diffuse the strain energy to the outside as heat, and thus it is possible to prevent a crack from being generated on the interface between the polymer matrix and the piezoelectric particles.

In the piezoelectric film 12, it is preferable that the storage elastic modulus (E') at a frequency of 1 Hz according to the dynamic viscoelasticity measurement is 10 to 30 GPa at 0° C., and 1 to 10 GPa at 50° C.

Accordingly, the piezoelectric film 12 is able to have large frequency dispersion in the storage elastic modulus (E') at room temperature. That is, the piezoelectric film 12 is able to be rigid with respect to a vibration of 20 Hz to 20 kHz, and is able to be flexible with respect to a vibration of less than or equal to a few Hz.

In addition, in the piezoelectric film 12, it is preferable that the product of the thickness and the storage elastic modulus (E') at a frequency of 1 Hz according to the dynamic viscoelasticity measurement is $1.0 \times 10^6$ to $2.0 \times 10^6$ N/m at 0° C., and $1.0 \times 10^5$ to $1.0 \times 10^6$ N/m at 50° C.

Accordingly, the piezoelectric film 12 is able to have appropriate rigidity and mechanical strength within a range not impairing the flexibility and the acoustic properties.

Furthermore, in the piezoelectric film 12, it is preferable that the loss tangent (Tan δ) at a frequency of 1 kHz at 25° C. is greater than or equal to 0.05 in a master curve obtained by the dynamic viscoelasticity measurement.

Accordingly, the frequency properties of a speaker using the piezoelectric film 12 are smoothened, and thus it is also possible to decrease the changed amount of acoustic quality in a case where the lowest resonance frequency $f_0$ is changed according to a change in the curvature of the speaker.

Next, an example of a manufacturing method of the piezoelectric film 12 will be described with reference to FIGS. 3 to 7.

Figure 3:
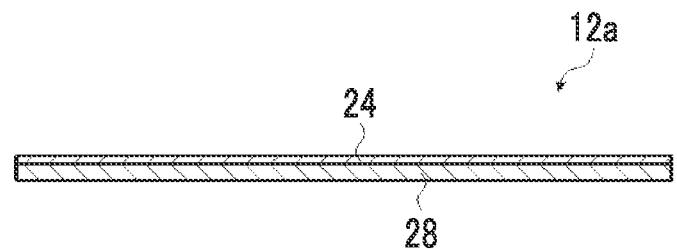
FIG. 3 is a conceptual diagram for describing an example of a production method of the piezoelectric film.

First, as illustrated in FIG. 3, a sheet-like material 12a is prepared in which the lower electrode 24 is formed on the lower protective layer 28. The sheet-like material 12a may be produced by forming a copper thin film or the like as the lower electrode 24 on the surface of the lower protective layer 28 using vacuum vapor deposition, sputtering, plating, or the like.

In a case where the lower protective layer 28 is extremely thin, and thus the handleability is degraded, the lower protective layer 28 with a separator (temporary support) may be used as necessary. As the separator, a PET film having a thickness of 25 to 100 μm, and the like are able to be used. The separator may be removed after thermal compression bonding of the upper electrode 26 and the upper protective layer 30 and before laminating any member on the lower protective layer 28.

On the other hand, a coating material is prepared by dissolving a polymer material having viscoelasticity at room temperature, such as cyanoethylated PVA, in an organic solvent, further adding the piezoelectric particles 36 such as PZT particles thereto, and stirring and dispersing the resultant. In the following description, the polymer material having viscoelasticity at room temperature, such as cyanoethylated PVA, is also referred to as a "viscoelastic material".

The organic solvent is not limited, and various organic solvents such as dimethylformamide (DMF), methyl ethyl ketone, and cyclohexanone are able to be used.

Figure 4:
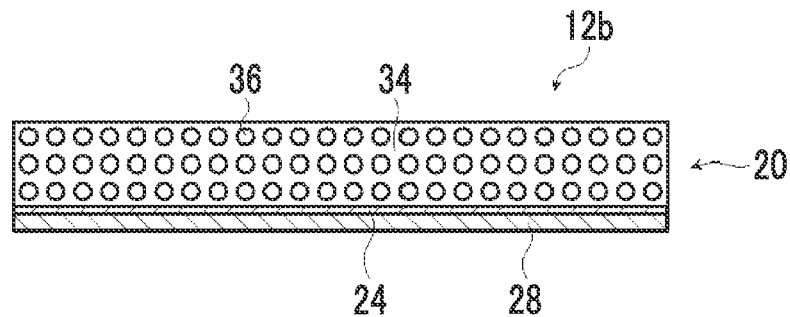
FIG. 4 is a conceptual diagram for describing an example of the production method of the piezoelectric film.

In a case where the sheet-like material 12a is prepared and the coating material is prepared, the coating material is cast (applied) onto the sheet-like material 12a, and the organic solvent is evaporated and dried. Accordingly, as illustrated in FIG. 4, a laminate 12b in which the lower electrode 24 is provided on the lower protective layer 28 and the piezoelectric layer 20 is formed on the lower electrode 24 is produced. The lower electrode 24 refers to an electrode on the base material side in a case where the piezoelectric layer 20 is applied, and does not indicate the vertical positional relationship in the laminate.

A casting method of the coating material is not particularly limited, and all known coating methods (coating devices) such as a slide coater or a doctor knife are able to be used.

Alternatively, in a case where the viscoelastic material is a material that is able to be heated and melted like cyanoethylated PVA, a melted material may be produced by heating and melting the viscoelastic material and adding and dispersing the piezoelectric particles 36 therein, extruded into a sheet shape on the sheet-like material 12a illustrated in FIG. 3 by extrusion molding or the like, and cooled, thereby producing the laminate 12b in which the lower electrode 24 is provided on the lower protective layer 28 and the piezoelectric layer 20 is formed on the lower electrode 24 as illustrated in FIG. 4.

As described above, in the piezoelectric film 12, in addition to the viscoelastic material such as cyanoethylated PVA, a polymer piezoelectric material such as PVDF may be added to the viscoelastic matrix 34.

In a case where the polymer piezoelectric material is added to the viscoelastic matrix 34, the polymer piezoelectric material added to the coating material may be dissolved. Alternatively, the polymer piezoelectric material to be added may be added to the heated and melted viscoelastic material and may be heated and melted.

After the laminate 12b in which the lower electrode 24 is provided on the lower protective layer 28 and the piezoelectric layer 20 is formed on the lower electrode 24 is produced, the piezoelectric layer 20 is subjected to polarization processing (poling).

A polarization processing method of the piezoelectric layer 20 is not limited, and a known method is able to be used. As a preferable polarization processing method, a method illustrated in FIGS. 5 and 6 is exemplified.

Figure 5:
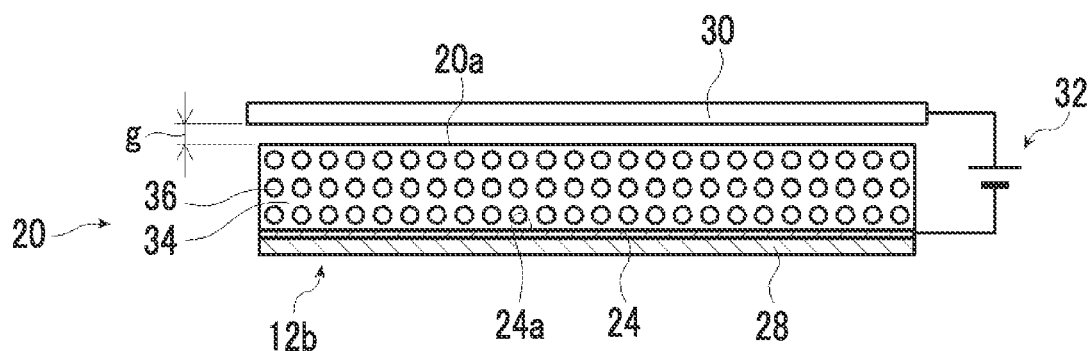
FIG. 5 is a conceptual diagram for describing an example of the production method of the piezoelectric film.
Figure 6:
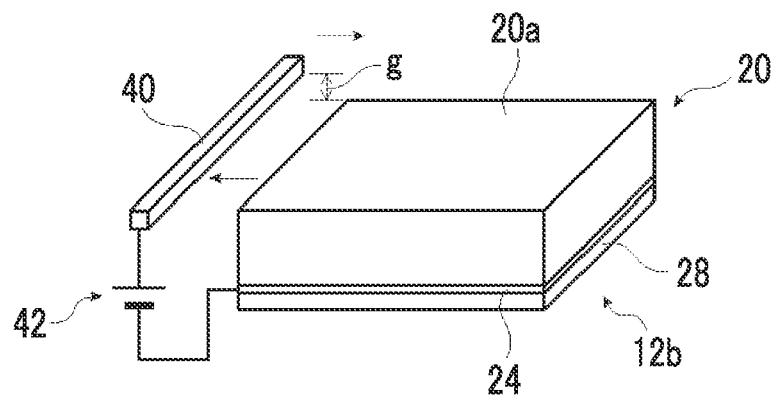
FIG. 6 is a conceptual diagram for describing an example of the production method of the piezoelectric film.

In this method, as illustrated in FIGS. 5 and 6, for example, an interval g of 1 mm is opened on an upper surface 20a of the piezoelectric layer 20 of the laminate 12b, and a rod-like or wire-like corona electrode 40 which is able to be moved along the upper surface 20a is provided. Then, the corona electrode 40 and the lower electrode 24 are connected to a direct-current power source 42.

Furthermore, a heating unit for heating and holding the laminate 12b, for example, a hot plate, is prepared.

Then, in a state where the piezoelectric layer 20 is heated and held by the heating unit, for example, at a temperature of 100° C., a direct-current voltage of a few kV, for example, 6 kV, is applied between the lower electrode 24 and the corona electrode 40 from the direct-current power source 42, and thus a corona discharge occurs. Furthermore, in a state where the interval g is maintained, the corona electrode 40 is moved (scanned) along the upper surface 20a of the piezoelectric layer 20, and the piezoelectric layer 20 is subjected to the polarization processing.

Accordingly, the piezoelectric layer 20 is polarized in the thickness direction.

In the polarization processing using such corona discharge, a known rod-like moving unit may be used to move the corona electrode 40. In the following description, for convenience, the polarization processing using corona discharge is also referred to as corona poling processing.

In addition, in the corona poling processing, a method of moving the corona electrode 40 is not limited. That is, the corona electrode 40 is fixed, a moving mechanism for moving the laminate 12b is provided, and the polarization processing may be performed by moving the laminate 12b. A known moving unit for moving a sheet-like material may be used to move the laminate 12b.

Furthermore, the number of corona electrodes 40 is not limited to one, and the corona poling processing may be performed by using a plurality of corona electrodes 40.

In addition, the polarization processing is not limited to the corona poling processing, and normal electric field poling processing in which a direct-current electric field is directly applied to an object to be subjected to the polarization processing may also be used. However, in a case where this normal electric field poling processing is performed, it is necessary that the upper electrode 26 is formed before the polarization processing.

Before the polarization processing, calendar processing may be performed to smoothen the surface of the piezoelectric layer 20 using a heating roller or the like. By performing the calendar processing, a thermal compression bonding process described below is able to be smoothly performed.

In this way, while the piezoelectric layer 20 of the laminate 12b is subjected to the polarization processing, a sheet-like material 12c is prepared in which the upper electrode 26 is formed on the upper protective layer 30. This sheet-like material 12c may be produced by forming a copper thin film or the like as the upper electrode 26 on the surface of the upper protective layer 30 using vacuum vapor deposition, sputtering, plating, or the like.

Figure 7:
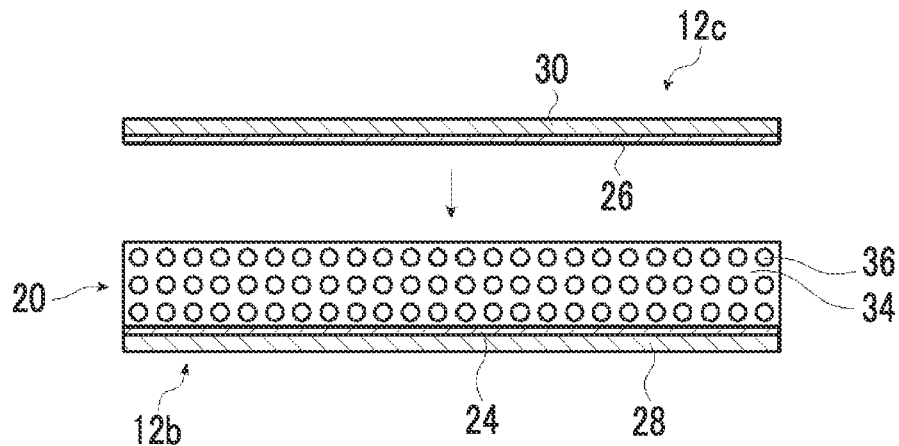
FIG. 7 is a conceptual diagram for describing an example of the production method of the piezoelectric film.

Next, as illustrated in FIG. 7, the sheet-like material 12c is laminated on the laminate 12b in which the piezoelectric layer 20 is subjected to the polarization processing while the upper electrode 26 faces the piezoelectric layer 20.

Furthermore, a laminate of the laminate 12b and the sheet-like material 12c is interposed between the upper protective layer 30 and the lower protective layer 28, and is subjected to the thermal compression bonding using a heating press device, a heating roller pair, or the like such that the piezoelectric film 12 is produced.

As will be described later, the laminated piezoelectric element 10 of the present invention has a configuration in which the piezoelectric films 12 are laminated and bonded to each other with the bonding layer 14 as a preferable embodiment. Here, in the laminated piezoelectric element 10 of the present invention, as indicated by the arrows attached to the piezoelectric layer 20 in FIG. 1, the polarization directions of adjacent piezoelectric films 12 are opposite to each other.

A general laminated ceramic piezoelectric element in which piezoelectric ceramic materials are laminated is subjected to polarization processing after producing a laminate of the piezoelectric ceramic materials. Only common electrodes exist at the interface between the piezoelectric layers, so that the polarization directions of the piezoelectric layers alternate in the lamination direction.

Contrary to this, the piezoelectric films 12 constituting the laminated piezoelectric element 10 of the present invention can be subjected to polarization processing in the state of the piezoelectric films 12 before lamination. The piezoelectric films 12 constituting the laminated piezoelectric element 10 of the present invention are preferably subjected to polarization processing of the piezoelectric layer 20 by corona poling processing before laminating the upper electrode 26 and the upper protective layer 30, as illustrated in FIGS. 5 and 6.

Therefore, the laminated piezoelectric element 10 of the present invention can be produced by laminating the piezoelectric films 12 subjected to the polarization processing. Preferably, a long piezoelectric film (large-area piezoelectric film) subjected to the polarization processing is produced and cut into individual piezoelectric films 12, and then the piezoelectric films 12 are laminated to form the laminated piezoelectric element 10 of the present invention.

Therefore, in the laminated piezoelectric element 10 of the present invention, the polarization directions of adjacent piezoelectric films 12 can be aligned in the lamination direction, or can be alternated as illustrated in FIG. 1.

As illustrated in FIG. 1, the laminated piezoelectric element 10 of the present invention has a configuration in which a plurality of layers (three layers in the illustrated example) of piezoelectric films 12 are laminated so that the polarization directions of adjacent piezoelectric films 12 are opposite to each other, and the adjacent piezoelectric films 12 are bonded by the bonding layer 14.

In the present invention, various known bonding layers 14 can be used as long as the adjacent piezoelectric films 12 can be bonded.

Therefore, the bonding layer 14 may be a layer consisting of an adhesive, which has fluidity during bonding and thereafter becomes a solid, a layer consisting of a pressure sensitive adhesive which is a gel-like (rubber-like) flexible solid during bonding and does not change in the gel-like state thereafter, or a layer consisting of a material having characteristics of both an adhesive and a pressure sensitive adhesive.

Here, for example, the laminated piezoelectric element 10 of the present invention vibrates a vibration plate 50 as described later and generates a sound by stretching and contracting the plurality of laminated piezoelectric films 12. Therefore, in the laminated piezoelectric element 10 of the present invention, it is preferable that the stretching and contracting of each piezoelectric film 12 is directly transmitted. In a case where a substance having a viscosity that attenuates vibration is present between the piezoelectric films 12, the efficiency of transmitting the stretching and contracting energy of the piezoelectric film 12 is lowered, and the driving efficiency of the laminated piezoelectric element 10 is also decreased.

In consideration of this point, the bonding layer 14 is preferably an adhesive layer consisting of an adhesive with which a solid and hard bonding layer 14 is obtained, rather than a pressure sensitive adhesive layer consisting of a pressure sensitive adhesive. As a more preferable bonding layer 14, specifically, a bonding layer consisting of a thermoplastic type adhesive such as a polyester-based adhesive or a styrene-butadiene rubber (SBR)-based adhesive is suitably exemplified.

Adhesion, unlike pressure sensitive adhesion, is useful in a case where a high adhesion temperature is required. Furthermore, the thermoplastic type adhesive has "relatively low temperature, short time, and strong adhesion" and is suitable.

In the laminated piezoelectric element 10 of the present invention, the thickness of the bonding layer 14 is not limited, and a thickness capable of exhibiting sufficient bonding force (adhesive force or pressure sensitive adhesive force) may be appropriately set depending on the forming material of the bonding layer 14.

Here, in the laminated piezoelectric element 10 of the present invention, the thinner the bonding layer 14, the higher the transmission effect of the stretching and contracting energy (vibration energy) of the piezoelectric layer 20, and the higher the energy efficiency. In addition, in a case where the bonding layer 14 is thick and has high rigidity, there is a possibility that the stretching and contracting of the piezoelectric film 12 may be constrained. Furthermore, as will be described later, in the laminated piezoelectric element 10 of the present invention, since there is no concern that the adjacent piezoelectric films 12 may be short-circuited, the bonding layer 14 can be made thin.

In consideration of this point, the bonding layer 14 is preferably thinner than the piezoelectric layer 20. That is, in the laminated piezoelectric element 10 of the present invention, the bonding layer 14 is preferably hard and thin.

Specifically, the thickness of the bonding layer 14 is preferably 0.1 to 50 μm, more preferably 0.1 to 30 μm, and even more preferably 0.1 to 10 μm in terms of thickness after bonding.

In the laminated piezoelectric element 10 of the present invention, in a case where the spring constant of the bonding layer 14 is high, there is a possibility that the stretching and contracting of the piezoelectric film 12 may be constrained. Therefore, the spring constant of the bonding layer 14 is preferably equal to or less than the spring constant of the piezoelectric film 12. The spring constant is "thickness x Young's modulus".

Specifically, the product of the thickness of the bonding layer 14 and the storage elastic modulus (E') at a frequency of 1 Hz according to the dynamic viscoelasticity measurement is preferably $2.0 \times 10^6$ N/m or less at 0° C. and $1.0 \times 10^6$ N/m or less at 50° C.

It is preferable that the internal loss of the bonding layer at a frequency of 1 Hz according to the dynamic viscoelasticity measurement is 1.0 or less at 25° C. in the case of the bonding layer 14 consisting of a pressure sensitive adhesive, and is 0.1 or less at 25° C. in the case of the bonding layer 14 consisting of an adhesive.

In the laminated piezoelectric element of the embodiment of the present invention, the bonding layer 14 is provided as a preferable embodiment and is not an essential constituent element.

Therefore, the laminated piezoelectric element of the embodiment of the present invention does not have the bonding layer 14, and the laminated piezoelectric element may be configured by laminating and closely attaching the piezoelectric films 12 constituting the laminated piezoelectric element using a known pressure bonding unit, a fastening unit, a fixing unit, or the like. For example, in a case where the piezoelectric film 12 is rectangular, the laminated piezoelectric element may be configured by fastening four corners with members such as bolts and nuts, and furthermore, the laminated piezoelectric element may be configured by fastening a center portion in the same manner. Alternatively, the laminated piezoelectric element may be configured by laminating the piezoelectric films 12 and thereafter bonding the peripheral portion (end surface) with a pressure sensitive adhesive tape to fix the laminated piezoelectric films 12.

However, in this case, in a case where a driving voltage is applied from the power source 16, the individual piezoelectric films 12 stretch and contract independently, and in some cases, layers of the piezoelectric films 12 bend in opposite directions and form a void. As described above, in a case where the individual piezoelectric films 12 stretch and contract independently, the driving efficiency of the laminated piezoelectric element decreases, the degree of stretching and contracting of the laminated piezoelectric element as a whole decreases, and there is a possibility that an abutting vibration plate or the like cannot sufficiently vibrate. In particular, in a case where the layers of the piezoelectric films 12 bend in the opposite directions and form a void, the driving efficiency of the laminated piezoelectric element is greatly decreased.

In consideration of this point, it is preferable that the laminated piezoelectric element of the embodiment of the present invention has the bonding layer 14 for bonding adjacent piezoelectric films 12 to each other, as in the laminated piezoelectric element 10 of the illustrated example.

As illustrated in FIG. 1, the power source 16 for applying the driving voltage for stretching and contracting the piezoelectric film 12 is connected to the lower electrode 24 and the upper electrode 26 of each of the piezoelectric films 12.

The power source 16 is not limited and may be a direct-current power source or an alternating-current power source. In addition, as for the driving voltage, a driving voltage capable of appropriately driving each of the piezoelectric films 12 may be appropriately set according to the thickness, forming material, and the like of the piezoelectric film 12 of the piezoelectric layer 20.

As will be described later, in the laminated piezoelectric element 10 of the present invention, the polarization directions of the adjacent piezoelectric films 12 are opposite. Therefore, in the adjacent piezoelectric films 12, the lower electrodes 24 face each other and the upper electrodes 26 face each other. Therefore, the power source 16 always supplies power of the same polarity to the facing electrodes regardless of whether the power source 16 is an alternating-current power source or a direct-current power source. For example, in the laminated piezoelectric element 10 illustrated in FIG. 1, the upper electrode 26 of the piezoelectric film 12 in the lowermost layer in the figure and the upper electrode 26 of the piezoelectric film 12 in the second layer (middle layer) are always supplied with power of the same polarity, and the lower electrode 24 of the piezoelectric film 12 in the second layer and the lower electrode 24 of the piezoelectric film 12 in the uppermost layer in the figure are always supplied with power of the same polarity.

A method of leading out an electrode from the lower electrode 24 and the upper electrode 26 is not limited, and various known methods can be used.

As an example, a method of leading out an electrode to the outside by connecting a conductor such as a copper foil to the lower electrode 24 and the upper electrode 26, and a method of leading out an electrode to the outside by forming through-holes in the lower protective layer 28 and the upper protective layer 30 by a laser or the like and filling the through-holes with a conductive material are exemplified.

As a suitable method of leading out an electrode, the method described in JP2014-209724A, the method described in JP2016-015354A, and the like are exemplified.

As described above, the laminated piezoelectric element 10 of the present invention has a configuration in which a plurality of layers of piezoelectric films 12 are laminated and adjacent piezoelectric films 12 are bonded to each other by the bonding layer 14.

In addition, in the laminated piezoelectric element 10 of the present invention, the polarization directions of the adjacent piezoelectric films 12 are opposite to each other. Specifically, in the laminated piezoelectric element 10 of the present invention, the polarization directions of the piezoelectric layers 20 of the adjacent piezoelectric films 12 are opposite to each other.

That is, in the laminated piezoelectric element 10 of the present invention, the piezoelectric films 12 are laminated so that the polarization directions alternate in the lamination directions of the piezoelectric films 12. The lamination direction of the piezoelectric film 12 is, that is, the thickness direction of each layer.

Figure 8:
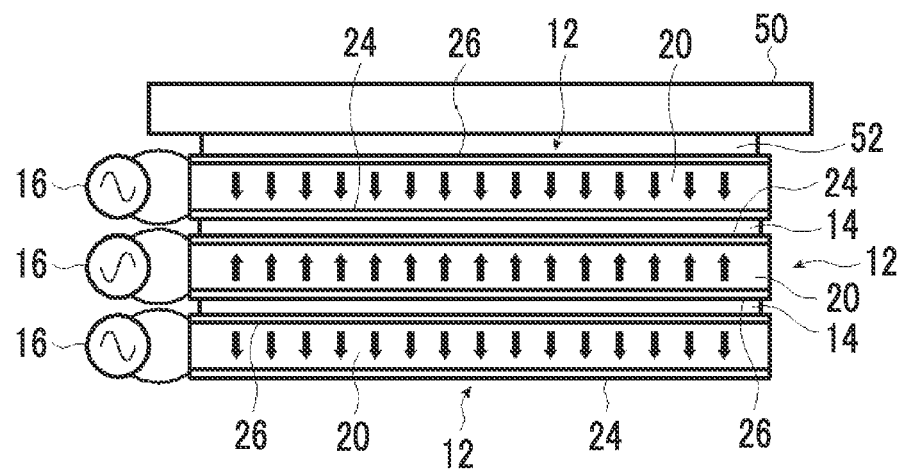
FIG. 8 is a diagram conceptually illustrating an example of an electroacoustic transducer of the present invention.

As an example, as conceptually illustrated in FIG. 8, the laminated piezoelectric element 10 of the present invention is adhered to the vibration plate 50 by a bonding layer 52, and is used as an exciter for generating a sound from the vibration plate 50. That is, FIG. 8 illustrates an example of an electroacoustic transducer of the embodiment of the present invention.

Also in FIG. 8, the lower protective layer 28 and the upper protective layer 30 are omitted for simplifying the drawings.

As described above, in the laminated piezoelectric element 10 of the present invention, the piezoelectric layer 20 included in the piezoelectric films 12 which are laminated in a plurality of layers is formed by dispersing the piezoelectric particles 36 in the viscoelastic matrix 34. In addition, the lower electrode 24 and the upper electrode 26 are provided so as to sandwich the piezoelectric layer 20 therebetween in the thickness direction.

In a case where a voltage is applied to the lower electrode 24 and the upper electrode 26 of the piezoelectric film 12 having the piezoelectric layer 20, the piezoelectric particles 36 stretch and contract in the polarization direction according to the applied voltage. As a result, the piezoelectric film 12 (piezoelectric layer 20) contracts in the thickness direction. At the same time, the piezoelectric film 12 stretches and contracts in the surface direction due to the Poisson's ratio.

The degree of stretching and contracting is about 0.01% to 0.1%.

As described above, the thickness of the piezoelectric layer 20 is preferably about 10 to 300 µm. Therefore, the degree of stretching and contracting in the thickness direction is as very small as about 0.3 µm at the maximum.

Contrary to this, the piezoelectric film 12, that is, the piezoelectric layer 20, has a size much larger than the thickness in the surface direction. Therefore, for example, in a case where the length of the piezoelectric film 12 is 20 cm, the piezoelectric film 12 stretches and contracts by a maximum of about 0.2 mm as a voltage is applied.

As described above, the vibration plate 50 is bonded to the laminated piezoelectric element 10 by the bonding layer 52. Therefore, the stretching and contracting of the piezoelectric film 12 causes the vibration plate 50 to bend, and as a result, the vibration plate 50 vibrates in the thickness direction.

The vibration plate 50 emits a sound due to the vibration in the thickness direction. That is, the vibration plate 50 vibrates according to the magnitude of the voltage (driving voltage) applied to the piezoelectric film 12, and generates a sound according to the driving voltage applied to the piezoelectric film 12.

Here, it is known that in a case where a general piezoelectric film consisting of a polymer material such as PVDF is stretched in a uniaxial direction after being subjected to polarization processing, the molecular chains are oriented with respect to the stretching direction, and as a result, high piezoelectric properties are obtained in the stretching direction. Therefore, a general piezoelectric film has in-plane anisotropy in the piezoelectric properties, and has anisotropy in the amount of stretching and contracting in the surface direction in a case where a voltage is applied.

Contrary to this, in the laminated piezoelectric element 10 of the present invention, the piezoelectric film 12 consisting of a polymer composite piezoelectric body in which piezoelectric particles are dispersed in a viscoelastic matrix achieves high piezoelectric properties without stretching after the polarization processing. Therefore, the piezoelectric film 12 has no in-plane anisotropy in the piezoelectric properties, and stretches and contracts isotropically in all directions in the surface direction. That is, in the laminated piezoelectric element 10 of the present invention, the piezoelectric film 12 stretches and contracts isotropically and two-dimensionally. According to the laminated piezoelectric element 10 of the present invention in which such piezoelectric films 12 that stretch and contract isotropically and two-dimensionally are laminated, compared to a case where general piezoelectric films made of PVDF or the like that stretch and contract greatly in only one direction are laminated, the vibration plate 50 can be vibrated with a large force, and a louder and more beautiful sound can be generated.

As described above, the laminated piezoelectric element of the embodiment of the present invention is a laminate of a plurality of such piezoelectric films 12. In the laminated piezoelectric element 10 of the illustrated example, as a preferable embodiment, adjacent piezoelectric films 12 are further bonded to each other by the bonding layer 14.

Therefore, even though the rigidity of each piezoelectric film 12 is low and the stretching and contracting force thereof is small, the rigidity is increased by laminating the piezoelectric films 12, and the stretching and contracting force as the laminated piezoelectric element 10 is increased. As a result, in the laminated piezoelectric element 10 of the present invention, even in a case where the vibration plate 50 has a certain degree of rigidity, the vibration plate 50 is sufficiently bent with a large force and the vibration plate 50 can be sufficiently vibrated in the thickness direction, whereby the vibration plate 50 can generate a sound.

In addition, the thicker the piezoelectric layer 20, the larger the stretching and contracting force of the piezoelectric film 12, but the larger the driving voltage required for stretching and contracting by the same amount. Here, as described above, in the laminated piezoelectric element 10 of the present invention, a preferable thickness of the piezoelectric layer 20 is about 300 μm at the maximum. Therefore, even in a case where the voltage applied to each piezoelectric film 12 is small, it is possible to sufficiently stretch and contract the piezoelectric films 12.

Here, in the laminated piezoelectric element 10 of the present invention, as described above, the polarization directions of the piezoelectric layers 20 of the adjacent piezoelectric films 12 are opposite to each other.

In the piezoelectric film 12, the polarity of the voltage applied to the piezoelectric layer 20 depends on the polarization direction. Therefore, regarding the polarity of the applied voltage, in the polarization directions indicated by the arrows in FIGS. 1 and 8, the polarity of the electrode on the side in a direction in which the arrows are directed, that is, the downstream side of the arrows, and the polarity of the electrode on the opposite side, that is, the upstream side of the arrows are coincident with each other in all the piezoelectric films 12.

In the illustrated example, the electrode on the side in the direction in which the arrows indicating the polarization direction are directed is the lower electrode 24, the electrode on the opposite side is the upper electrode 26, and the polarities of the upper electrode 26 and the lower electrode 24 are the same in all the piezoelectric films 12.

Therefore, in the laminated piezoelectric element 10 of the present invention in which the polarization directions of the piezoelectric layers 20 of the adjacent piezoelectric films 12 are opposite to each other, in the adjacent piezoelectric films 12, the upper electrodes 26 face each other on one surface, and the lower electrodes face each other on the other surface. Therefore, in the laminated piezoelectric element 10 of the present invention, even in a case where the electrodes of the adjacent piezoelectric films 12 come into contact with each other, there is no risk of a short circuit.

As described above, in order to stretch and contract the laminated piezoelectric element 10 with good energy efficiency, it is preferable to make the bonding layer 14 thin so that the bonding layer 14 does not interfere with the stretching and contracting of the piezoelectric layer 20.

Furthermore, as described above, in a general laminated ceramic piezoelectric element in which piezoelectric ceramic materials are laminated, polarization processing is performed after producing a laminate of piezoelectric ceramic materials. Only common electrodes exist at the interface between the piezoelectric layers, so that the polarization directions of the piezoelectric layers alternate in the lamination direction.

Figure 13:
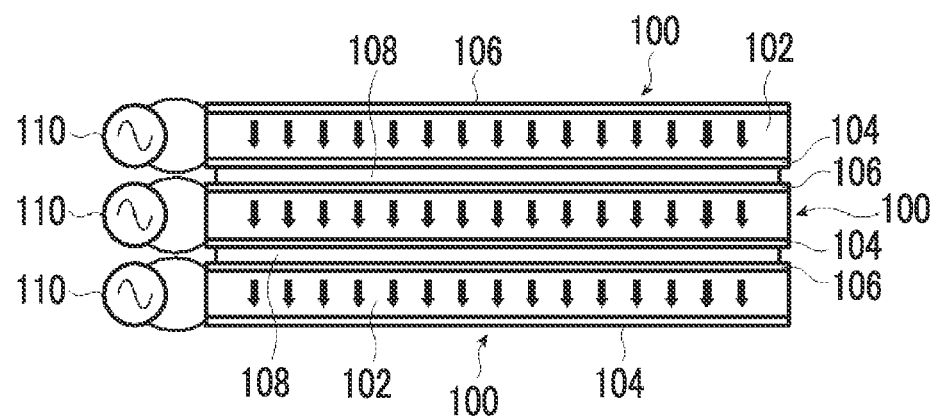
FIG. 13 is a diagram conceptually illustrating an example of a laminated piezoelectric element in the related art.

As illustrated in FIG. 13, in a laminated piezoelectric element in which the polarization directions of laminated piezoelectric films 100 are all the same, a lower electrode 104 and an upper electrode 106 face each other between the adjacent piezoelectric films 100. Therefore, in a case where an adhesive layer 108 is not made sufficiently thick, the lower electrodes 104 and the upper electrodes 106 of the adjacent piezoelectric films 100 may come into contact with each other at the outer end portion of the adhesive layer 108 in the surface direction, and there is a risk of a short circuit. That is, as illustrated in FIG. 13, in the laminated piezoelectric element of the related art in which the polarization directions of piezoelectric layers 102 of the laminated piezoelectric films 100 are all the same, the adhesive layer 108 cannot be made thin, and the laminated piezoelectric element cannot be stretched and contracted with good energy efficiency.

Contrary to this, in the laminated piezoelectric element of the embodiment of the present invention in which there is no risk of a short circuit even in a case where the electrodes of the adjacent piezoelectric films 12 come into contact with each other, the bonding layer 14 may be omitted. In addition, since the laminated piezoelectric element of the embodiment of the present invention does not have a risk of a short circuit, even in a case where the bonding layer 14 is provided as a preferable embodiment, the bonding layer 14 can be made extremely thin as long as a required bonding force can be obtained.

Therefore, according to the present invention, the laminated piezoelectric element 10 can be stretched and contracted with high energy efficiency.

As described above, in the piezoelectric film 12, the absolute amount of stretching and contracting of the piezoelectric layer 20 in the thickness direction is very small, and the stretching and contracting of the piezoelectric film 12 is substantially only in the surface direction.

Therefore, even in a case where the polarization directions of the laminated piezoelectric films 12 are opposite to each other, all the piezoelectric films 12 stretch and contract in the same direction as long as the polarities of the voltages applied to the lower electrode 24 and the upper electrode 26 are correct.

In the laminated piezoelectric element 10 of the present invention, the polarization direction of the piezoelectric film 12 may be detected by a d33 meter or the like.

Alternatively, the polarization direction of the piezoelectric layer 20 may be known from the processing conditions of the corona poling processing described above.

In the electroacoustic transducer of the embodiment of the present invention using the laminated piezoelectric element of the embodiment of the present invention, the bonding layer that bonds the laminated piezoelectric element 10 to the vibration plate 50 is not limited, and various known pressure sensitive adhesives and adhesives can be used. As an example, the same as the above-mentioned bonding layer 14 is exemplified.

In the electroacoustic transducer of the embodiment of the present invention using the laminated piezoelectric element of the embodiment of the present invention, the vibration plate 50 is not limited, and various articles can be used.

As the vibration plate 50, for example, plate materials such as resin plates and glass plates, advertisement or notification media such as signboards, office devices and furniture such as tables, whiteboards, and projection screens, display devices such as organic electroluminescence (organic light emitting diode (OLED)) displays and liquid crystal displays, members for vehicles including automobiles such as consoles, A-pillars, roofs, and bumpers, and building materials such as walls of houses are exemplified.

In the laminated piezoelectric element 10 of the illustrated example, preferably, as described above, a long (large-area) piezoelectric film is produced, and the long piezoelectric film is cut into individual piezoelectric films 12. Therefore, in this case, the plurality of piezoelectric films 12 constituting the laminated piezoelectric element 10 are all the same.

However, the present invention is not limited thereto. That is, the laminated piezoelectric element of the embodiment of the present invention can use various configuration such as a configuration in which piezoelectric films having different layer configurations, such as the piezoelectric film having the lower protective layer 28 and the upper protective layer 30 and a piezoelectric film having no lower protective layer and no upper protective layer, are laminated, a configuration in which piezoelectric films in which the thicknesses of the piezoelectric layers 20 are different are laminated, and the like.

In the laminated piezoelectric element 10 illustrated in FIG. 1 and the like, a plurality of piezoelectric films 12 are laminated so that the polarization directions of adjacent piezoelectric films are opposite to each other, and as a preferable embodiment, the adjacent piezoelectric films 12 are bonded by the bonding layer 14.

The present invention is not limited thereto, and various configurations can be used as long as a plurality of layers of piezoelectric films are laminated and the polarization directions of adjacent piezoelectric films are opposite to each other.

Figure 9:
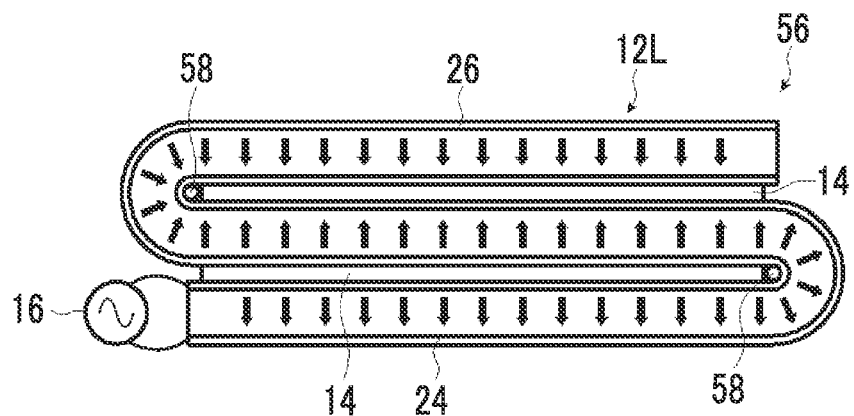
FIG. 9 is a diagram conceptually illustrating another example of the laminated piezoelectric element of the present invention.

FIG. 9 illustrates an example thereof. Since the laminated piezoelectric element 56 illustrated in FIG. 9 uses a plurality of the same members of the above-mentioned laminated piezoelectric element 10, the same members are designated by the same reference numerals, and the description will be given mainly to different parts.

The laminated piezoelectric element 56 illustrated in FIG. 9 is a more preferable embodiment of the laminated piezoelectric element of the embodiment of the present invention, in which a plurality of layers of a piezoelectric film 12L are laminated by folding back the piezoelectric film 12L a plurality of times. In addition, similarly to the laminated piezoelectric element 10 illustrated in FIG. 1 and the like described above, in the laminated piezoelectric element 56 shown in FIG. 9, as a preferable embodiment, the piezoelectric film 12L laminated by folding-back is bonded by the bonding layer 14.

By folding back and laminating one sheet of the piezoelectric film 12L polarized in the thickness direction, the polarization directions of the piezoelectric film 12L adjacent (facing) in the lamination direction become opposite directions.

According to the laminated piezoelectric element 56 illustrated in FIG. 9, the laminated piezoelectric element 56 can be configured with only one sheet of the piezoelectric film 12L. Furthermore, according to the laminated piezoelectric element 56 illustrated in FIG. 9, only one power source 16 for applying the driving voltage is required, and moreover, an electrode may be led out from the piezoelectric film 12L at one place.

Therefore, according to the laminated piezoelectric element 56 illustrated in FIG. 9, the number of components can be reduced, the configuration can be simplified, the reliability of the piezoelectric element (module) can be improved, and a further reduction in cost can be achieved.

Like the laminated piezoelectric element 56 illustrated in FIG. 9, in the laminated piezoelectric element 56 in which the piezoelectric film 12L is folded back, it is preferable to insert a core rod 58 into the folded-back portion of the piezoelectric film 12L while abutting the piezoelectric film 12L.

As described above, the lower electrode 24 and the upper electrode 26 of the piezoelectric film 12L are formed of a metal vapor deposition film or the like. In a case where the metal vapor deposition film is bent at an acute angle, cracks and the like are likely to occur, and there is a possibility that the electrode may be broken. That is, in the laminated piezoelectric element 56 illustrated in FIG. 9, cracks or the like are likely to occur in the electrodes inside the bent portion.

For this, in the laminated piezoelectric element 56 in which one sheet of the piezoelectric film 12L is folded back, by inserting the core rod 58 into the folded-back portion of the piezoelectric film 12L, the lower electrode 24 and the upper electrode 26 are prevented from being bent. Therefore, it is possible to preferably prevent the occurrence of breakage.

The shape of the core rod 58 is not limited, and various rod-shaped objects such as a columnar shape and a polygonal columnar shape can be used. The core rod 58 is preferably columnar (cylindrical) because the piezoelectric film 12L can be folded back without difficulty.

The size of the core rod 58, for example, the diameter in the case of a columnar core rod 58, is not limited, and may be appropriately set depending on the size of the laminated piezoelectric element 56, the thickness of the piezoelectric film 12L, the rigidity of the piezoelectric film 12L, and the like. In the case of the columnar core rod 58, the diameter is preferably 0.1 to 50 μm, and more preferably 0.1 to 5 μm. The size of the core rod 58 is preferably equal to the thickness of the bonding layer 14 after bonding.

A forming material of the core rod 58 is not limited, and various materials can be used as long as sufficient strength is achieved.

Here, the laminated piezoelectric element of the embodiment of the present invention may use the bonding layer 14 having conductivity. In particular, in the laminated piezoelectric element 56 in which one sheet of the piezoelectric film 12L is folded back and laminated as illustrated in FIG. 9, the bonding layer 14 having conductivity is preferably used.

In the laminated piezoelectric element of the embodiment of the present invention, in the laminated piezoelectric film 12, electric power having the same polarity is supplied to the facing electrodes. Therefore, a short circuit does not occur between the facing electrodes.

On the other hand, as described above, in the laminated piezoelectric element 56 in which the piezoelectric film 12L is folded back and laminated, the electrode is likely to be broken inside the bent portion that is folded back at an acute angle.

Therefore, by bonding the laminated piezoelectric film 12L with the bonding layer 14 having conductivity, even in a case where the electrode is broken inside the bent portion, electrical conduction can be secured by the bonding layer 14, which prevents breakage and significantly improves the reliability of the laminated piezoelectric element 56.

Here, the piezoelectric film 12L forming the laminated piezoelectric element of the embodiment of the present invention preferably has the lower protective layer 28 and the upper protective layer 30 so that the lower electrode 24 and the upper electrode 26 face each other so as to interpose the laminate therebetween as illustrated in FIG. 2.

In this case, even in a case where the bonding layer 14 having conductivity is used, the conductivity cannot be secured. Therefore, in a case where the piezoelectric film 12L has a protective layer, through-holes are provided in the lower protective layer 28 and the upper protective layer 30 in regions where the lower electrodes 24 face each other and the upper electrodes 26 face each other in the laminated piezoelectric film 12L, and the bonding layer 14 having conductivity is brought into contact with the lower electrode 24 and the upper electrode 26.

In this case, the through-holes of the lower protective layer 28 and the upper protective layer 30 may be formed by removal of the protective layers through laser processing, solvent etching, mechanical polishing, or the like. In addition, in terms of a production method, the piezoelectric film 12L can be produced by using the lower protective layer 28 and the upper protective layer 30 in which through-holes are formed in advance.

The number of through-holes of the lower protective layer 28 and the upper protective layer 30 may be one or more in the regions where the lower electrodes 24 face each other and the upper electrodes 26 face each other in the laminated piezoelectric film 12L. Alternatively, the through-holes of the lower protective layer 28 and the upper protective layer 30 may be formed regularly or irregularly on the entire surface of the lower protective layer 28 and the upper protective layer 30.

Preferably, the through-holes formed in the lower protective layer 28 and the upper protective layer 30 are closed with a silver paste or a conductive bonding agent, and the adjacent piezoelectric film 12L is bonded thereto with the bonding layer 14 having conductivity such as a conductive tape.

In a case where the bonding layer 14 having conductivity is used, in a case where the number of through-holes of the lower protective layer 28 and the upper protective layer 30 is one or more in the regions where the lower electrodes 24 face each other and the upper electrodes 26 face each other in the laminated piezoelectric film 12L excluding the bent portion, and preferably, one or more in regions including the center portion of the laminated piezoelectric film 12L, the reliability of the laminated piezoelectric element 56 can be significantly improved.

The bonding layer 14 having conductivity is not limited, and various known bonding layers can be used.

Therefore, the bonding layer 14 having conductivity may be one having conductivity itself such as an adhesive or a pressure sensitive adhesive forming the bonding layer 14. Alternatively, the bonding layer 14 having conductivity may be a bonding layer 14 provided with conductivity by dispersing metal particles, a conductive filler, a metal fiber, or the like in an adhesive, a pressure sensitive adhesive, or the like with no conductivity. In addition, for example, a silver paste that is cured by drying, such as DOTITE manufactured by Fujikura Kasei Co., Ltd., can also be used.

Here, as illustrated in FIG. 9, the laminated piezoelectric element in which one sheet of piezoelectric film is folded back to laminate a plurality of piezoelectric films is considered to have two configurations. In the following description, the laminated piezoelectric element in which one sheet of piezoelectric film is folded back to laminate a plurality of piezoelectric films is also referred to as a "laminated piezoelectric element in which a piezoelectric film is folded back and laminated" for convenience.

The first configuration is such that a bent portion of the piezoelectric film formed by the folding-back extends along the longitudinal direction of the laminated piezoelectric element. That is, the first configuration is such that the bent portion of the piezoelectric film formed by the folding-back coincides with the longitudinal direction of the laminated piezoelectric element.

The second configuration is such that a bent portion of the piezoelectric film formed by the folding-back extends along the lateral direction of the laminated piezoelectric element. That is, the second configuration is such that the bent portion of the piezoelectric film formed by the folding-back coincides with the lateral direction of the laminated piezoelectric element.

In other words, the laminated piezoelectric element in which the piezoelectric film is folded back and laminated is considered to have the configuration in which the ridge formed by folding back the piezoelectric film coincides with the longitudinal direction of the laminated piezoelectric element and the configuration in which the ridge coincides with the lateral direction of the laminated piezoelectric element.

Specifically, in a case of producing a 20×5 cm laminated piezoelectric element by folding back one sheet of piezoelectric film to laminate five layers of the piezoelectric film, the following two configurations are considered.

Figure 10:
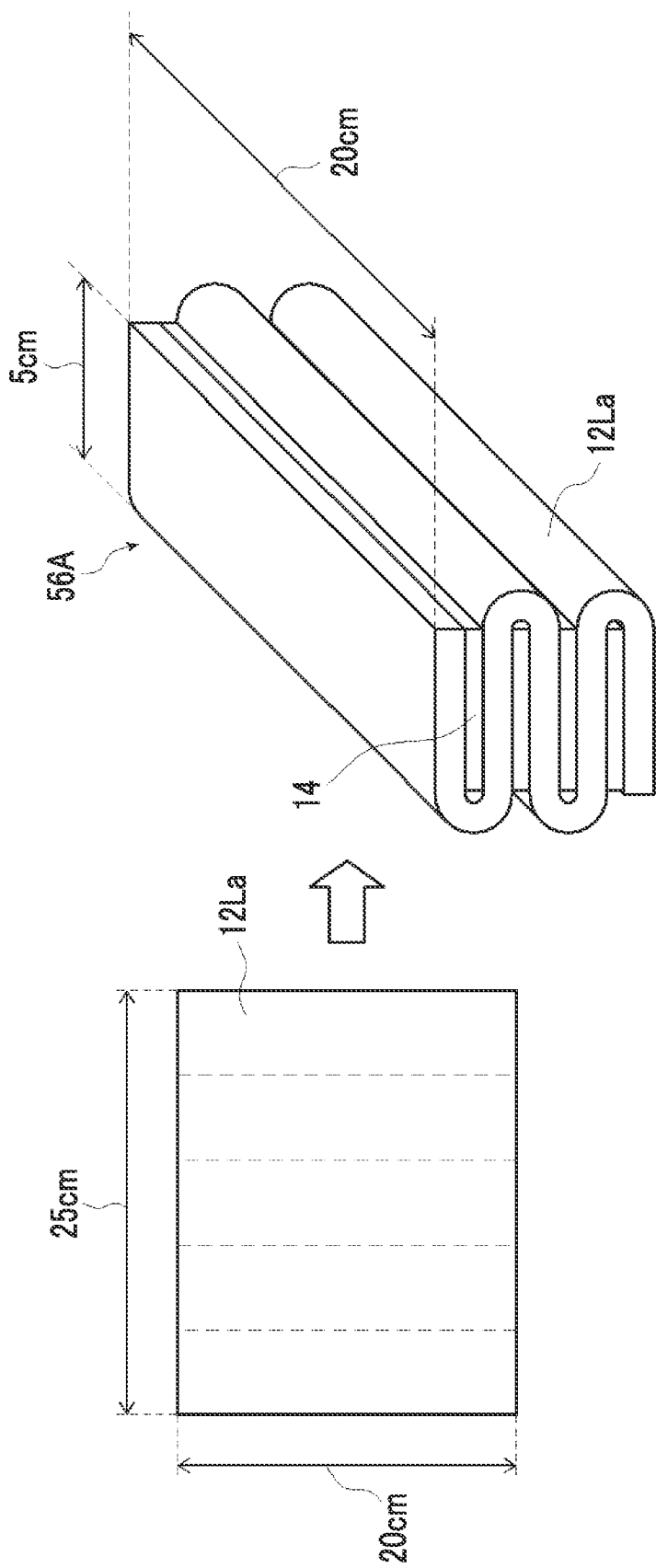
FIG. 10 is a diagram conceptually illustrating another example of the laminated piezoelectric element of the present invention.

The first configuration is a laminated piezoelectric element 56A in which, as conceptually illustrated in FIG. 10, a rectangular piezoelectric film 12La of 20×25 cm is folded back four times by 5 cm in the direction of 25 cm to laminate five layers of the piezoelectric film 12La. In the laminated piezoelectric element 56A, a bent portion of the piezoelectric film 12La formed by the folding-back extends along the direction of 20 cm, which is the longitudinal direction of the laminated piezoelectric element 56A. That is, in the laminated piezoelectric element 56A, the ridge formed by folding back the piezoelectric film 12La coincides with the longitudinal direction of the laminated piezoelectric element 56A.

Figure 11:
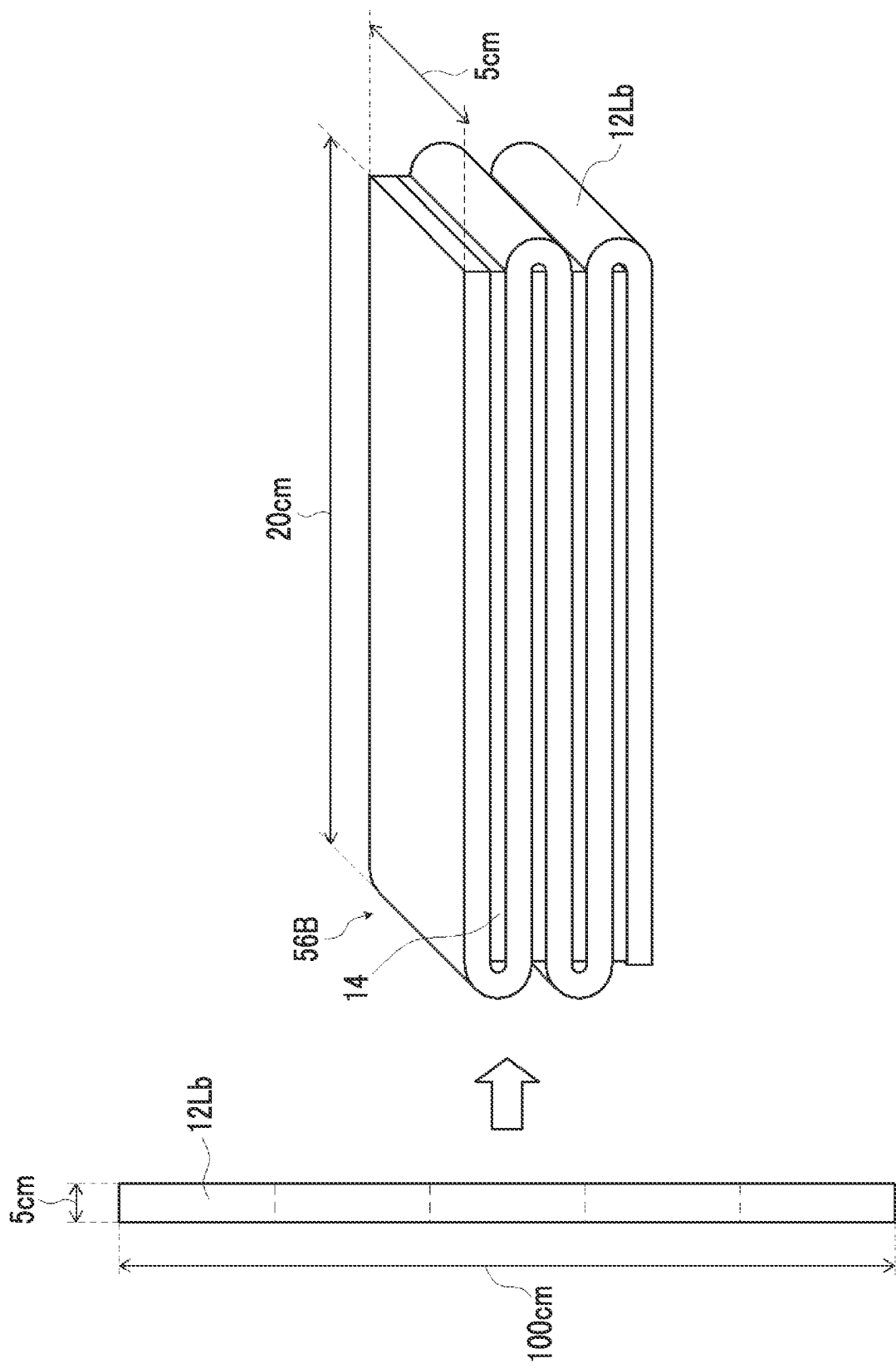
FIG. 11 is a diagram conceptually illustrating another example of the laminated piezoelectric element of the present invention.

The second configuration is a laminated piezoelectric element 56I in which, as conceptually illustrated in FIG. 11, a rectangular piezoelectric film 12Lb of 100×5 cm is folded back four times by 20 cm in the direction of 100 cm to laminate five layers of the piezoelectric film 12Lb. In the laminated piezoelectric element 56B, a bent portion of the piezoelectric film 12Lb formed by the folding-back extends along the direction of 5 cm, which is the lateral direction of the laminated piezoelectric element 56B. That is, in the laminated piezoelectric element 56B, the ridge formed by folding back the piezoelectric film 12Lb coincides with the lateral direction of the laminated piezoelectric element 56B.

In the present invention, the laminated piezoelectric element in which the piezoelectric film is folded back and laminated can be suitably used in any of the configuration in which the bent portion of the piezoelectric film formed by the folding-back extends along the longitudinal direction of the laminated piezoelectric element or the configuration in which the bent portion extends along the lateral direction of the laminated piezoelectric element.

That is, the configuration in which the bent portion of the piezoelectric film formed by the folding-back extends along the longitudinal direction of the laminated piezoelectric element and the configuration in which the bent portion extends along the lateral direction of the laminated piezoelectric element. Therefore, which configuration to use may be appropriately set according to the usage of the laminated piezoelectric element and the like.

For example, like the laminated piezoelectric element 56A, in the configuration in which the bent portion of the piezoelectric film 12La formed by the folding-back extends along the longitudinal direction, breakage of the lower electrode 24 and the upper electrode 26 is suitably prevented, and a highly reliable laminated piezoelectric element can be obtained.

As described above, the lower electrode 24 and the upper electrode 26 of the piezoelectric film 12La are formed of a metal vapor deposition film or the like. In a case where the metal vapor deposition film is bent, cracks and the like are likely to occur. In a case where cracks occur in the electrode (electrode layer) is cracked, the resistance of the cracked area increases. Therefore, in a case where a current flows through the cracked area, heat will be generated by the resistance, which may cause a failure such as breakage.

Such problems can be improved by lowering the current density.

Contrary to this, in the laminated piezoelectric element in which the piezoelectric film is folded back and laminated, since the bent portion extends along the longitudinal direction, the width of the bent portion is widened with respect to the current flow, and the current density of the current flowing through the bent portion is lowered. As a result, it is possible to suppress heat generation caused by cracks in the electrodes and prevent breakage. Therefore, like the laminated piezoelectric element 56A, in the configuration in which the bent portion of the piezoelectric film 12La formed by the folding-back extends along the longitudinal direction, a highly reliable laminated piezoelectric element can be obtained.

In addition, the laminated piezoelectric element may be provided with a lead-out wire which is connected to the lower electrode 24 and the upper electrode 26 and reaches to the outside of the laminated piezoelectric element for connection to an external device such as a power source device. The lead-out wire does not necessarily have to physically protrude to the outside, which means electrical lead-out from the electrode.

The lead-out wire can be formed by using the method described above. For example, the lead-out wire is provided by not providing the piezoelectric layer 20 in an end portion or an outwardly protruding region of the piezoelectric film to expose the lower electrode 24 and the upper electrode 26, and connecting the lead-out wire thereto. As another example, the lead-out wire is provided by peeling off a protective film and an electrode layer from an end portion or an outwardly protruding region of the piezoelectric film, and inserting a copper foil tape or the like between the piezoelectric layer 20 and the electrode layer. As yet another example, the lead-out wire is provided by providing a through-hole in the protective layer of the piezoelectric film in an end portion or an outwardly protruding region of the piezoelectric film, forming an electrical conduction member in the through-hole using a conductive paste such as a silver paste, and connecting a copper foil tape or the like to the electrical conduction member.

Figure 12:
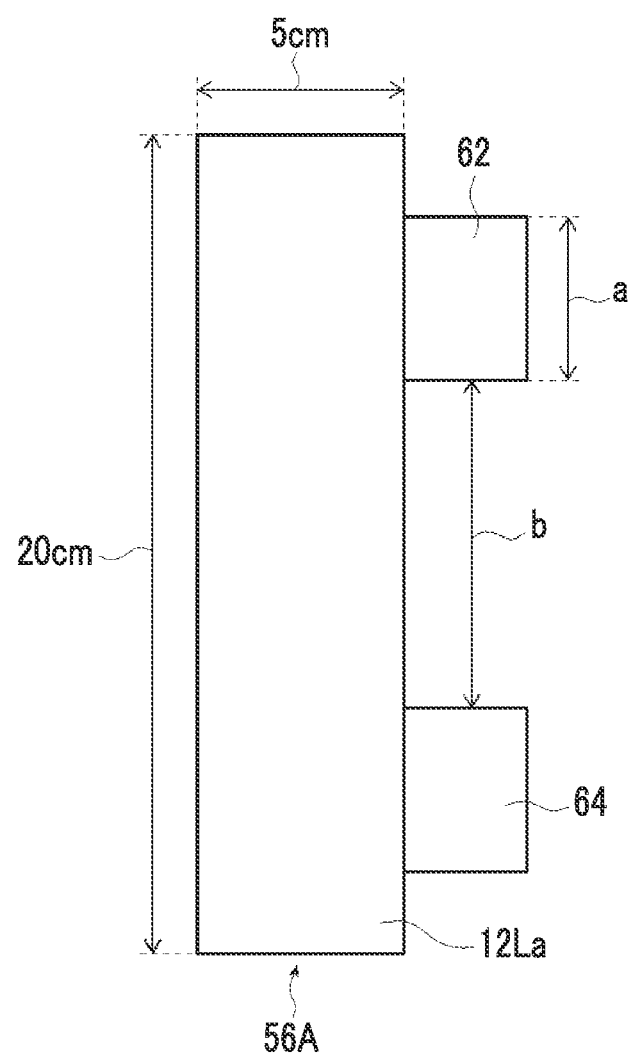
FIG. 12 is a conceptual diagram for describing a lead-out wire of the laminated piezoelectric element of the present invention.

In the laminated piezoelectric element in which the piezoelectric film is folded back and laminated, the lead-out wire is usually provided at an end portion of the piezoelectric film 12La in the folding-back direction, as conceptually illustrated in FIG. 12 by exemplifying the laminated piezoelectric element 56A.

That is, in the case of the laminated piezoelectric element 56A illustrated in FIG. 10, the lead-out wire is provided at an end portion of the width of 20 cm of the piezoelectric film 12La on the longitudinal side. On the other hand, in the case of the laminated piezoelectric element 56B illustrated in FIG. 11, the lead-out wire is provided at an end portion of the width of 5 cm of the piezoelectric film 12Lb on the lateral side.

In addition, as illustrated in FIG. 12, as the lead-out wire, a lead-out wire 62 connected to the lower electrode 24 and a lead-out wire 64 connected to the upper electrode 26 are provided.

Here, there are various methods of providing the lead-out wire. However, in an embodiment in which the lower electrode 24 and the upper electrode 26 protrude outward as they are and function as lead-out wires by not providing the piezoelectric layer 20 in the end portion or the outwardly protruding region of the piezoelectric film to expose the lower electrode 24 and the upper electrode 26, particularly the connection portions between the lead-out wires and the lower electrode 24 and the upper electrode 26 of the piezoelectric film are parts where the current density sharply increases and heat is easily generated. Therefore, it is preferable that the lead-out wire has a large width. That is, in the case of the laminated piezoelectric element 56A, it is preferable that the width a of the lead-out wire 62 and the lead-out wire 64 illustrated in FIG. 12 is large.

In the laminated piezoelectric element in which the piezoelectric film is folded back and laminated, the width (width direction) indicates the length in the direction of a side where the lead-out wire exists. That is, in the case of the laminated piezoelectric element 56A and the piezoelectric film 12La illustrated in FIG. 10, the width is 20 cm. In addition, in the case of the laminated piezoelectric element 56B and the piezoelectric film 12Lb illustrated in FIG. 11, the width is 5 cm.

Furthermore, a preferable thickness of the piezoelectric layer 20 of the piezoelectric film is as very small as 10 to 300 μm. Therefore, in order to prevent a short circuit, it is preferable to provide the lead-out wires at different positions in the surface direction of the piezoelectric film. That is, it is preferable that the lead-out wires are provided so as to be offset in the surface direction of the piezoelectric film.

In addition, in the laminated piezoelectric element in which the piezoelectric film is folded back and laminated, it is preferable that the lead-out wires serving as heat generation portions are spaced from each other as much as possible in the width direction. That is, in the case of the laminated piezoelectric element 56A, it is preferable that the interval b between the lead-out wire 62 and the lead-out wire 64 illustrated in FIG. 12 in the width direction is wide.

Contrary to this, in the laminated piezoelectric element in which the piezoelectric film is folded back and laminated, since the bent portion extends along the longitudinal direction, the width of the piezoelectric film at the connection portion of the lead-out wire can be large.

Therefore, the laminated piezoelectric element in which the bent portion extends along the longitudinal direction can widen the width of the lead-out wire without overlapping the lead-out wires in the surface direction of the piezoelectric film, and can widen the gap in the width direction between the lead-out wires. Therefore, in the laminated piezoelectric element in which the piezoelectric film is folded back and laminated, the laminated piezoelectric element in which the bent portion extends along the longitudinal direction can suitably prevent a short circuit and can suitably suppress heat generation.

In the laminated piezoelectric element in which the piezoelectric film is folded back and laminated, the width of the lead-out wire is not limited, but as described above, is preferably large.

Here, in the laminated piezoelectric element in which the piezoelectric film is folded back and laminated, the linear current density of the lead-out wire is preferably set to 1 A/cm or less in order to suppress heat generation in the lead-out wire. The linear current density of the lead-out wire is a value obtained by dividing the current value [A] of the current flowing into the lead-out wire by the width [cm] of the lead-out wire.

In the laminated piezoelectric element in which the piezoelectric film is folded back and laminated, the width of the lead-out wire (the length in the direction of the side where the lead-out wire exists) is preferably 10% or more (1/10 or more), more preferably 20% or more, and even more preferably 30% or more of the width of the piezoelectric film. That is, in the case of the laminated piezoelectric element 56A in which the bent portion extends along the longitudinal direction as illustrated in FIGS. 10 and 12, since the width of the piezoelectric film 12La is 20 cm, the width a of the lead-out wire 62 and the lead-out wire 64 is preferably set to 2 cm or more.

As the width of the piezoelectric film increases, the electrostatic capacitance of the piezoelectric film increases (impedance decreases), so that the amount of current flowing through the piezoelectric film for the same applied voltage increases. However, by setting the width of the lead-out wire to 10% or more of the width of the piezoelectric film, the linear current density of the lead-out wire can be stably set to 1 A/cm or less.

In addition, by setting the thickness of the electrode layer to 0.1 µm or more, the current density obtained by dividing the amount of current flowing through the lead-out wire by the cross-sectional area of the lead-out wire can be $1 \times 10^{-5}$ A/cm² or less, which is preferable.

In the laminated piezoelectric element in which the piezoelectric film is folded back and laminated, the interval in the width direction of the lead-out wire is also not limited, but as described above, is preferably wide.

The interval in the width direction of the lead-out wire is preferably 25% or more (¼ or more), more preferably 30% or more, and even more preferably 40% or more of the width of the piezoelectric film.

That is, in the case of the laminated piezoelectric element 56A in which the bent portion extends along the longitudinal direction as illustrated in FIGS. 10 and 12, since the width of the piezoelectric film 12La is 20 cm, the interval b in the width direction between the lead-out wire 62 and the lead-out wire 64 is preferably set to 5 cm or more.

Regarding the linear current density of the lead-out wire and the width and interval of the lead-out wire described above, the same applies to not only the laminated piezoelectric element 56A in which the bent portion extends along the longitudinal direction but also the laminated piezoelectric element 56B in which the bent portion extends along the lateral direction.

On the other hand, in the laminated piezoelectric element in which the piezoelectric film is folded back and laminated, like the laminated piezoelectric element 56B illustrated in FIG. 11, the laminated piezoelectric element in which the bent portion of the piezoelectric film 12Lb formed by the folding-back extends along the lateral direction is preferable in terms of maximizing the vibration efficiency.

That is, since the bent portion itself formed by the folding-back is also stretched and contracted strictly, a vibration mode different from the stretching and contracting mode of the laminated piezoelectric element occurs. Therefore, the laminated piezoelectric element in which the bent portion extends along the lateral direction does not need to consume energy in an unnecessary vibration mode compared to the laminated piezoelectric element in which the bent portion extends along the longitudinal direction.

In the laminated piezoelectric element of the present invention, as for forming methods of the lead-out wire 62 and the lead-out wire 64, various configurations can be used in addition to the configurations illustrated in FIG. 12.

Figure 16:
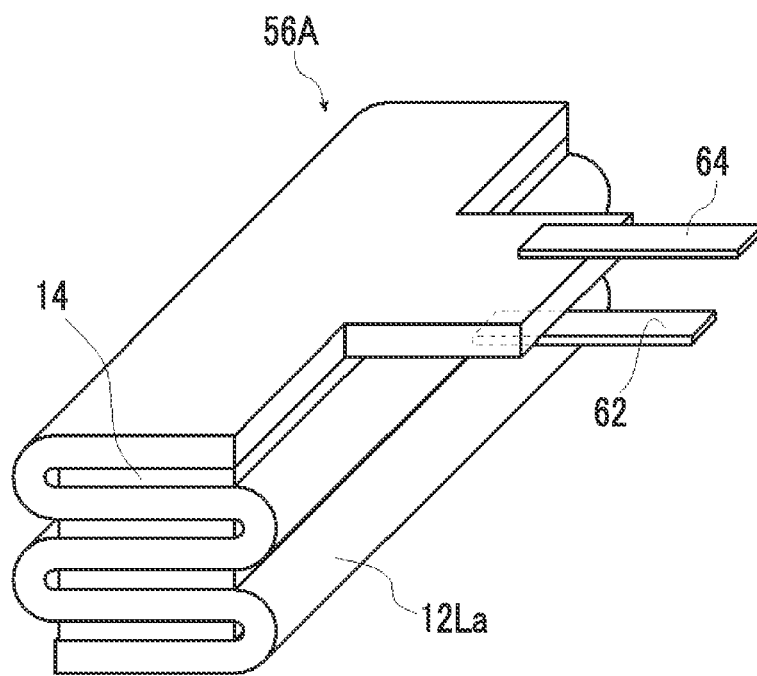
FIG. 16 is a diagram conceptually illustrating another example of the laminated piezoelectric element of the present invention.

For example, in the case of the laminated piezoelectric element 56A in which the bent portion of the piezoelectric film 12La formed by the folding-back extends along the longitudinal direction, as conceptually illustrated in FIG. 16, a protruding island-shaped protruding portion may be provided at one end portion in the folding-back direction, and the lead-out wire 62 and the lead-out wire 64 may be connected thereto.

Figure 17:
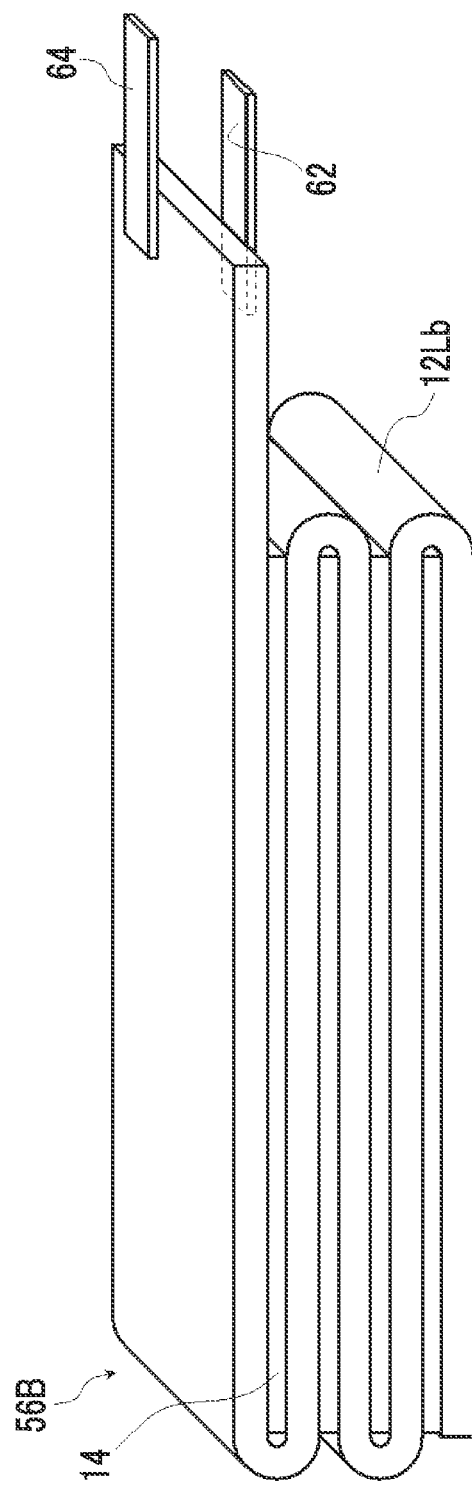
FIG. 17 is a diagram conceptually illustrating another example of the laminated piezoelectric element of the present invention.

In addition, in the case of the laminated piezoelectric element 56B in which the bent portion of the piezoelectric film 12Lb formed by the folding-back extends along the lateral direction, as conceptually illustrated in FIG. 17, one end portion in the folding-back direction may be extended, and the lead-out wire 62 and the lead-out wire 64 may be connected to the extended end portion.

Figure 18:
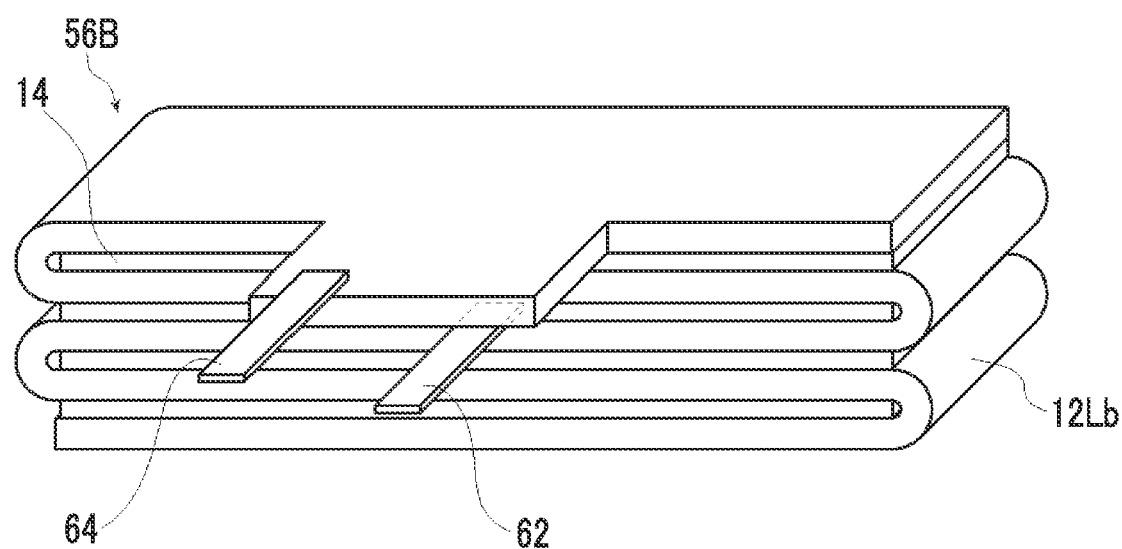
FIG. 18 is a diagram conceptually illustrating another example of the laminated piezoelectric element of the present invention.

Furthermore, in the case of the laminated piezoelectric element 56B in which the bent portion of the piezoelectric film 12Lb formed by the folding-back extends along the lateral direction, as conceptually illustrated in FIG. 18, a protruding island-shaped protruding portion may be provided at an end portion in a direction perpendicular to the folding-back direction, that is, an end portion in the longitudinal direction of the piezoelectric film 12Lb, and the lead-out wire 62 and the lead-out wire 64 may be connected thereto.

While the laminated piezoelectric element and the electroacoustic transducer of the embodiment of the present invention have been described in detail, the present invention is not limited to the examples described above, and various improvements or modifications may be naturally performed within a range not deviating from the gist of the present invention.

EXAMPLES

Hereinafter, the present invention will be described in more detail with reference to specific examples of the present invention.

[Production of Piezoelectric Film]

A piezoelectric film as illustrated in FIG. 2 was produced by the method illustrated in FIGS. 3 to 7 described above.

First, cyanoethylated PVA (CR-V manufactured by Shin-Etsu Chemical Co., Ltd.) was dissolved in methyl ethyl ketone (MEK) at the following compositional ratio. Thereafter, PZT particles were added to this solution at the following compositional ratio, and were dispersed by using a propeller mixer (rotation speed 2000 rpm), and thus a coating material for forming a piezoelectric layer was prepared.

PZT Particles 1000 parts by mass
Cyanoethylated PVA 100 parts by mass
MEK 600 parts by mass In addition, the PZT particles were obtained by sintering commercially available PZT raw material powder at 1000° C. to 1200° C. and thereafter crushing and classifying the resultant so as to have an average particle diameter of 3.5 µm.

On the other hand, a sheet-like material in which a copper thin film having a thickness of 0.1 µm was vacuum vapor deposited on a long PET film having a width of 23 cm and a thickness of 4 µm as illustrated in FIG. 3 was prepared. That is, in this example, an upper electrode and a lower electrode are copper vapor deposition thin films having a thickness of 0.1 µm, and an upper protective layer and a lower protective layer are PET films having a thickness of 4 µm.

In order to obtain good handleability during the process, as the PET film, a film with a separator (temporary support PET) having a thickness of 50 µm attached thereto was used, and the separator of each protective layer was removed after the thermal compression bonding of thin film electrodes and the protective layers.

The coating material for forming the piezoelectric layer prepared as described above was applied onto the lower electrode of the sheet-like material by using a slide coater. The coating material was applied such that the film thickness of the coating film after being dried was 40 µm. As mentioned above, the lower electrode is the copper vapor deposition thin film.

The coating material was applied so as to provide uncoated portions having a width of 1 cm at both end portions in the width direction (lateral direction) of the long PET film. That is, the lower electrode (copper thin film) is exposed in the uncoated portions of 1 cm at both ends in the width direction (see FIG. 14).

Next, a material in which the coating material was applied onto the sheet-like material was heated and dried in an oven at 120° C. such that MEK was evaporated. Accordingly, as illustrated in FIG. 4, a laminate was produced in which the lower electrode made of copper was provided on the lower protective layer made of PET and the piezoelectric layer having a thickness of 40 µm was formed thereon.

The piezoelectric layer of the laminate was subjected to polarization processing in a thickness direction by corona poling processing illustrated in FIGS. 5 and 6 described above. Furthermore, the polarization processing was performed by setting the temperature of the piezoelectric layer to 100° C., and applying a direct-current voltage of 6 kV between the lower electrode and a corona electrode so as to cause corona discharge to occur.

On the laminate subjected to the polarization processing, the same sheet-like material obtained by vacuum vapor depositing a copper thin film on a PET film was laminated as illustrated in FIG. 7. The sheet-like material was also laminated so that the upper electrode protruded from the piezoelectric layer at both end portions in the width direction by a width of 1 cm (see FIG. 14).

Next, the laminate of the laminate and the sheet-like material was subjected to thermal compression bonding at 120° C. using a laminator device to adhere the piezoelectric layer to the upper electrode and the lower electrode, whereby a piezoelectric film as illustrated in FIG. 2 in which the piezoelectric layer was interposed between the upper electrode and the lower electrode and the laminate was interposed between the upper protective layer and the lower protective layer was produced.

Example 1

The produced piezoelectric film was cut into a rectangle of 5×8 cm. One end portion of the cut-out piezoelectric film in the longitudinal direction was set so as to be a region where the above-mentioned upper electrode and the lower electrode were exposed by 1 cm.

That is, the cut-out piezoelectric film has regions where the upper electrode and the lower electrode of 5×1 cm are exposed in one end portion in the longitudinal direction. Therefore, in this example, the piezoelectric layer has a thickness of 40 µm and a size in the surface direction of 5×7 cm.

Three cut piezoelectric films were laminated so that the polarization directions of adjacent piezoelectric films were opposite to each other, and the cut piezoelectric films were bonded with a bonding layer, thereby producing a laminated piezoelectric element as illustrated in FIG. 1.

An adhesive (TSU0041SI manufactured by Toyochem Co., Ltd.) was used as the bonding layer. The thickness of the bonding layer was set to 25 µm.

Alternating-current power sources were connected to the produced laminated piezoelectric element as illustrated in FIG. 1. In all the piezoelectric films, the AC power sources were connected so as to supply electric power having the same polarity to the upper electrodes and to supply electric power having the opposite polarity to the upper electrodes to the lower electrodes. Therefore, in this example, electric power having the same polarity is supplied to the facing electrodes of the laminated piezoelectric films. As described above, the lower electrode is an electrode on the base material side in a case where the piezoelectric layer is applied, and does not indicate the vertical positional relationship in the laminate.

Figure 14:
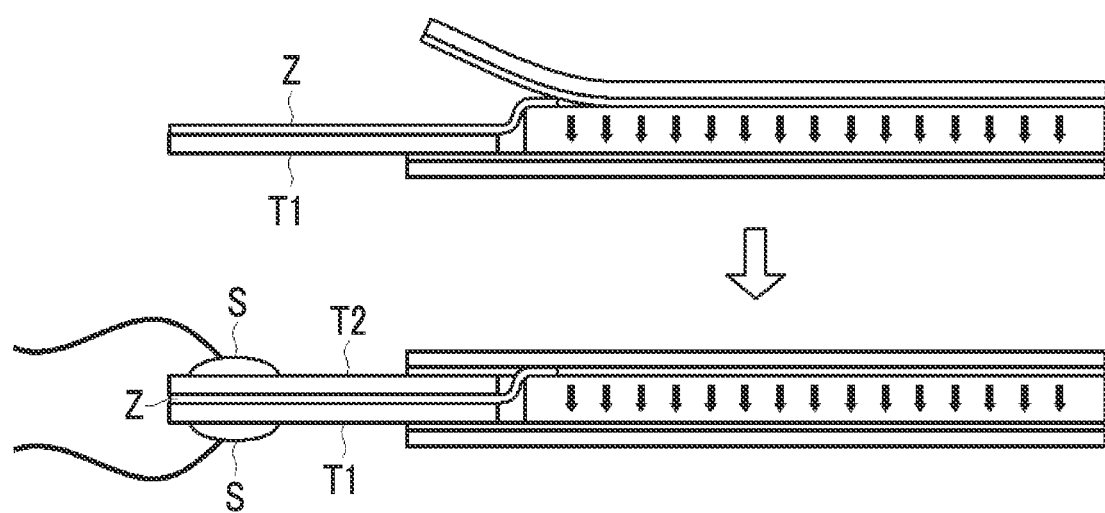
FIG. 14 is a conceptual diagram for describing an example of the present invention.

The lead-out of the electrodes in each piezoelectric film for connection to the AC power source was performed as conceptually illustrated in FIG. 14.

First, a copper foil tape T1 having a thickness of 12 µm was bonded to the lower electrode on the side where the electrode of the piezoelectric film was exposed. Next, an end portion on the upper electrode side was peeled off by about 2 to 3 mm, and an insulating double-sided tape Z having a thickness of 20 µm was inserted into the peeled portion and bonded so as to cover the copper foil tape T1.

Furthermore, a copper foil tape T2 having a thickness of 12 µm was bonded to the upper electrode side, and thereafter the copper foil tape T2 and the insulating double-sided tape Z were brought into contact with each other.

Lead-out lines L were connected to the copper foil tape T1 and the copper foil tape T2 by solder S, and the lead-out lines L were connected to the AC power source.

Example 2

A laminated piezoelectric element was produced in the same manner as in Example 1 except that the adhesive used for the bonding layer was changed to FB-ML4-50S manufactured by Nitto Denko Corporation and the thickness of the bonding layer was changed to 50 µm, and a power source was connected thereto.

Example 3

A laminated piezoelectric element was produced in the same manner as in Example 1 except that the bonding layer was changed to a double-sided tape having a thickness of 30 µm (No. 5603 manufactured by Nitto Denko Corporation), that is, a pressure sensitive adhesive layer, and a power source was connected.

Example 4

A laminated piezoelectric element was produced in the same manner as in Example 1 except that the bonding layer was changed to a double-sided tape having a thickness of 50

μm (No. 5919ML manufactured by Nitto Denko Corporation), that is, a pressure sensitive adhesive layer, and a power source was connected.

Example 5

A laminated piezoelectric element was produced in the same manner as in Example 1 except that three piezoelectric films were fixed by fixing end surfaces of the laminated piezoelectric films excluding electrode lead-out portions with a tape without providing the bonding layer, and a power source was connected.

Example 6

A produced long piezoelectric film was cut in the width direction to obtain a 5×23 cm sheet.

Next, in one end portion of the cut-out piezoelectric film in the longitudinal direction, a portion where the upper electrode and the lower electrode were exposed was cut. Therefore, in this example, the piezoelectric film has a size of 5×22 cm, and the piezoelectric layer has a thickness of 40 μm, and a size in the surface direction of 5×21 cm.

In a region where the piezoelectric film was folded back in the longitudinal direction so as to trisect the length of the piezoelectric layer into 7 cm and the piezoelectric film was laminated, the adjacent layers of the piezoelectric film were bonded by the bonding layer, thereby producing a laminated piezoelectric element in which three layers of the piezoelectric film were laminated as illustrated in FIG. 9 was produced. In this example, no core rod was provided at the folded-back portion.

An adhesive (TSU0041SI manufactured by Toyochem Co., Ltd.) was used as the bonding layer. The thickness of the bonding layer was set to 25 μm.

An AC power source was connected to the laminated piezoelectric element in the same manner as described above, as illustrated in FIG. 9. Therefore, in this example, there is only one power source connection.

Comparative Example 1

As illustrated in FIG. 13, a laminated piezoelectric element was produced in the same manner as in Example 1 except that the polarization directions of all the piezoelectric films coincided with each other, and a power source was connected. Therefore, in this example, the bonding layer is an adhesive layer having a thickness of 25 μm.

In this example, in the laminated piezoelectric films, the upper electrode and the lower electrode supplied with electric power having different polarities face each other.

Comparative Example 2

A laminated piezoelectric element was produced in the same manner as in Comparative Example 1 except that the thickness of the bonding layer was set to 70 μm, and a power source was connected.

[Evaluation]

As a vibration plate B, a PET film having a thickness of 300 μm and a size of 30×70 cm was prepared. The produced laminated piezoelectric element was fixed to the center of the vibration plate B so that the longitudinal direction and the lateral direction coincided with each other (see FIG. 15).

Figure 15:
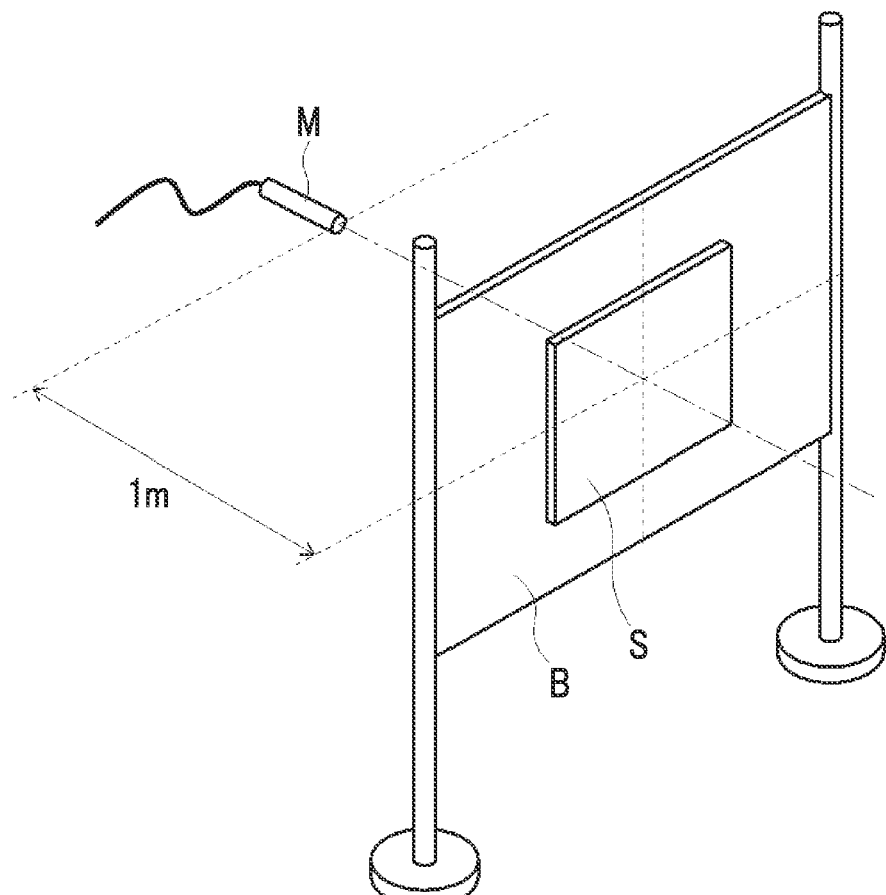
FIG. 15 is a conceptual diagram for describing a sound pressure measurement method in the example.

As conceptually illustrated in FIG. 15, the vibration plate B was erected by supporting both end edges of the vibration plate B having a size of 30×70 cm in the longitudinal direction. On the PET film (vibration plate) side, a microphone M was installed at a position 1 m from the center of the laminated piezoelectric element in the normal direction (direction perpendicular to the PET film), and the laminated piezoelectric element was driven to measure a sound pressure.

An input signal to the laminated piezoelectric element was a 1 kHz sine wave (80 Vp-p).

The results are shown in the table below.

TABLE 1

| | Polarization directions of adjacent piezoelectric films | Bonding layer Material | Thickness [μm] | Sound pressure level [dB] |
|---|---|---|---|---|
| Example 1 | Opposite directions (laminated) | Adhesive | 25 | 82 |
| Example 2 | Opposite directions (laminated) | Adhesive | 50 | 75 |
| Example 3 | Opposite directions (laminated) | Pressure sensitive adhesive | 30 | 78 |
| Example 4 | Opposite directions (laminated) | Pressure sensitive adhesive | 50 | 71 |
| Example 5 | Opposite directions (laminated) | — | — | 69 |
| Example 6 | Opposite directions (folded back) | Adhesive | 25 | 82 |
| Comparative Example 1 | Same direction (laminated) | Adhesive | 25 | Cannot be measured |
| Comparative Example 2 | Same direction (laminated) | Adhesive | 70 | 65 |

As shown in the above table, the laminated piezoelectric element of the embodiment of the present invention in which the polarization directions of adjacent piezoelectric films are opposite to each other can supply electric power having the same polarity to the facing electrodes. Therefore, even in a case where the thickness of the bonding layer is set to 50 μm or less, the vibration plate (PET film) is suitably vibrated without causing a short circuit between the adjacent piezoelectric films, and a sound having a high sound pressure can be produced.

Contrary to this, in the laminated piezoelectric element of Comparative Example 1 in which the polarization directions of adjacent piezoelectric films were the same, since electric power having opposite polarities was supplied to the facing electrodes, a short circuit had occurred between the adjacent piezoelectric films, and a sound pressure could not be measured. In addition, as shown in Comparative Example 2, even though a short circuit can be prevented by setting the thickness of the bonding layer to 70 μm, as shown in Table 1, the obtained sound pressure is lower than that in Example 5 in which no bonding layer is provided.

Further, as shown in Examples 1 and 2, and Examples 3 and 4, in the present invention, by using an adhesive layer having high hardness as the bonding layer, the vibration plate is vibrated more suitably, and a higher sound pressure can be obtained. In addition, as shown in Examples 1 and 3, and Examples 2 and 4, in the present invention, by thinning the bonding layer, the vibration plate is vibrated more suitably, and a higher sound pressure can be obtained.

In Example 1 in which three piezoelectric films are laminated and Example 6 in which a long piezoelectric film is folded back to laminate three layers of the piezoelectric film, since the bonding layers are the same (25 μm thick adhesive layer), the sound pressure levels are also the same. However, in Example 1 in which the three piezoelectric films are laminated, it is necessary to connect three power sources for driving, whereas in Example 6 in which the long piezoelectric film is folded back, one power source can be connected for driving.

Example 7 and Example 8

The piezoelectric film produced as described above was cut out into a size of 20×25 cm. This piezoelectric film was folded back four times in the direction of 25 cm at intervals of 5 cm. Accordingly, a 5×20 cm laminated piezoelectric element in which five layers of the piezoelectric film were laminated as illustrated in FIG. 10 was produced (Example 7). In this example, the bent portion of the piezoelectric film formed by the folding-back extends along the longitudinal direction of the laminated piezoelectric element.

On the other hand, the piezoelectric film produced as described above was cut out into a size of 5×100 cm. This piezoelectric film was folded back four times in the direction of 100 cm at intervals of 20 cm. Accordingly, a 5×20 cm laminated piezoelectric element in which five layers of the piezoelectric film were laminated as illustrated in FIG. 11 was produced (Example 8). In this example, the bent portion of the piezoelectric film formed by the folding-back extends along the lateral direction of the laminated piezoelectric element.

In the produced laminated piezoelectric element, the adjacent piezoelectric films were bonded in the same manner as in Example 6.

In one end portion in the folding-back direction of the produced piezoelectric film, the protective layer and the electrode layer were peeled off, an electrode for supplying driving power was inserted, and the resultant was returned to the original state. Then, a pink noise signal was supplied thereto at 30 Vrms for 6 hours to drive the laminated piezoelectric element.

After 6 hours, the temperature of the laminated piezoelectric element was measured, and the temperature of the hottest portion was compared. As a result, Example 7 reached 35° C. and Example 8 reached 50° C.

That is, in a laminated piezoelectric element in which one sheet of piezoelectric film is folded back to laminate a plurality layers of the piezoelectric film, it is advantageous to have a configuration in which the bent portion of the piezoelectric film formed by the folding-back extends along the longitudinal direction in terms of suppressing heat generation.

From the above results, the effect of the present invention is obvious.

The laminated piezoelectric element can be suitably used as an exciter or the like that abuts on various members to generate a sound.

EXPLANATION OF REFERENCES 10, 56, 56A, 56B: laminated piezoelectric element
12, 12L, 12La, 12Lb: piezoelectric film
12a, 12c: sheet-like material
12b: laminate
14, 52: bonding layer
16,110: power source
20, 102: piezoelectric layer
24: lower (thin film) electrode
26: upper (thin film) electrode
28: lower protective layer
30: upper protective layer
34: viscoelastic matrix
36: piezoelectric particles
40: corona electrode
42: direct-current power source
50: vibration plate
58: core rod
62, 64: lead-out wire
100: unit variable element
104: lower electrode
106: upper electrode
108: adhesive layer

What is claimed is:

1. A laminated piezoelectric element comprising:
a plurality of layers of laminated piezoelectric films having a piezoelectric layer interposed between two thin film electrodes, and
a bonding layer which bonds adjacent piezoelectric films to each other,
wherein the piezoelectric film is polarized in a thickness direction,
polarization directions of adjacent piezoelectric films are opposite to each other, and
the thickness of the bonding layer is 0.1 to 50 μm.

2. The laminated piezoelectric element according to claim 1,
wherein the piezoelectric film is laminated in a plurality of layers by folding back the piezoelectric film a plurality of times.

3. The laminated piezoelectric element according to claim 2,
wherein a folded-back portion of the piezoelectric film has a core rod.

4. The laminated piezoelectric element according to claim 2,
wherein a bent portion of the piezoelectric film formed by the folding-back extends along a longitudinal direction.

5. The laminated piezoelectric element according to claim 2,
wherein a bent portion of the piezoelectric film formed by the folding-back extends along a lateral direction.

6. The laminated piezoelectric element according to claim 1,
wherein at least one layer of the laminated piezoelectric film has a protective layer laminated on at least one of the thin film electrodes.

7. The laminated piezoelectric element according to claim 1,
wherein a thickness of the bonding layer is smaller than a thickness of the piezoelectric layer.

8. The laminated piezoelectric element according to claim 1,
wherein the bonding layer is a layer consisting of an adhesive.

9. The laminated piezoelectric element according to claim 1,
wherein a spring constant of the bonding layer is equal to or less than a spring constant of the piezoelectric film.

10. The laminated piezoelectric element according to claim 1,
wherein the bonding layer has conductivity.

11. The laminated piezoelectric element according to claim 1,
wherein, in the piezoelectric film, a local maximum value of a loss tangent (Tan δ) at a frequency of 1 Hz according to dynamic viscoelasticity measurement exists at room temperature.

12. The laminated piezoelectric element according to claim 1,
wherein the piezoelectric film has no in-plane anisotropy in piezoelectric properties.

13. The laminated piezoelectric element according to claim 1,
wherein the piezoelectric layer is a polymer composite piezoelectric layer in which piezoelectric particles are dispersed in a polymer material having a cyanoethyl group.

14. The laminated piezoelectric element according to claim 13,
wherein the polymer material is cyanoethylated polyvinyl alcohol.

15. The laminated piezoelectric element according to claim 1, further comprising:
a lead-out wire which is connected to the thin film electrode for connection to an external device,
wherein a value obtained by dividing a current value flowing into the lead-out wire by a width of the lead-out wire is 1 A/cm or less.

16. An electroacoustic transducer comprising:
the laminated piezoelectric element according to claim 1; and
a vibration plate in contact with the laminated piezoelectric element.

17. The laminated piezoelectric element according to claim 2,
wherein at least one layer of the laminated piezoelectric film has a protective layer laminated on at least one of the thin film electrodes.

* * * * *